(12) United States Patent
Knezevic et al.

(10) Patent No.: US 11,433,977 B2
(45) Date of Patent: *Sep. 6, 2022

(54) METHODS AND SYSTEMS FOR COMPONENT-BASED REDUCED ORDER MODELING FOR INDUSTRIAL-SCALE STRUCTURAL DIGITAL TWINS

(71) Applicant: Akselos S.A., Lausanne (CH)

(72) Inventors: David John Knezevic, Brookline, MA (US); Brian George Sabbey, Brookline, MA (US)

(73) Assignee: Akselos S.A., Lausanne (CH)

( * ) Notice: Subject to any disclaimer, the term of this patent is extended or adjusted under 35 U.S.C. 154(b) by 458 days.

This patent is subject to a terminal disclaimer.

(21) Appl. No.: 16/694,080

(22) Filed: Nov. 25, 2019

(65) Prior Publication Data
US 2021/0155325 A1 May 27, 2021

(51) Int. Cl.
*B63B 71/10* (2020.01)
*G06F 30/20* (2020.01)
(Continued)

(52) U.S. Cl.
CPC .............. *B63B 71/10* (2020.01); *B63B 3/14* (2013.01); *G06F 30/15* (2020.01); *G06F 30/20* (2020.01); *G06T 15/005* (2013.01)

(58) Field of Classification Search
CPC . B63B 71/10; B63B 3/14; G06F 30/20; G06F 30/15; G06T 15/005
See application file for complete search history.

(56) References Cited

U.S. PATENT DOCUMENTS 4,858,146 A   8/1989  Shebini
5,442,569 A   8/1995  Osano
(Continued)

FOREIGN PATENT DOCUMENTS

WO    2021105803 A1    6/2021

OTHER PUBLICATIONS

Antil et al., "Domain decomposition and balanced truncation and model reduction for shape optimization of the Stokes system," Optimization Methods & Software, (2010).
(Continued)

*Primary Examiner* — Xin Sheng
(74) *Attorney, Agent, or Firm* — Blueshift IP, LLC; Cynthia M. Gilbert

(57) ABSTRACT

A method for maintaining a physical asset based on recommendations generated by analyzing operational data and a composite model of a plurality of models representing the physical asset includes constructing, by a computing device, using a port-reduced static condensation reduced basis element approximation of at least a portion of a partial differential equation, the composite model. The computing device analyzes an error indicator associated with at least one model within the composite model to determine that the error indicator exceeds a tolerance level and increases a number of basis functions in the port-reduced static condensation reduced basis element approximation accordingly. The computing device receives first operational data associated with at least one region of the physical asset and updates the composite model. The computing device provides a recommendation for maintaining the physical asset, based upon the updated composite model.

19 Claims, 10 Drawing Sheets

(51) Int. Cl.
  G06F 30/15    (2020.01)
  B63B 3/14     (2006.01)
  G06T 15/00    (2011.01)

(56) References Cited

U.S. PATENT DOCUMENTS

| | | | |
|---|---|---|---|
| 6,349,272 | B1 | 2/2002 | Phillips |
| 8,046,200 | B2 | 10/2011 | Kirby et al. |
| 8,245,165 | B1 | 8/2012 | Tiwary et al. |
| 8,531,451 | B2 | 9/2013 | Mital |
| 9,213,788 | B2 | 12/2015 | Huynh |
| 9,818,136 | B1 | 11/2017 | Hoffberg |
| 10,210,295 | B2 | 2/2019 | Rosenbluth |
| 2004/0236450 | A1 | 11/2004 | Bryant |
| 2006/0282236 | A1 | 12/2006 | Wistmuller |
| 2009/0043547 | A1 | 2/2009 | Kirby et al. |
| 2009/0259447 | A1 | 10/2009 | Langemyr |
| 2009/0276061 | A1* | 11/2009 | Sheth ............... G05B 19/41885 700/29 |
| 2009/0322739 | A1 | 12/2009 | Rubin |
| 2011/0060704 | A1 | 3/2011 | Rubin |
| 2011/0257950 | A1* | 10/2011 | Kirby .................... G06F 17/175 703/2 |
| 2012/0179426 | A1 | 7/2012 | Fontes |
| 2013/0197886 | A1 | 8/2013 | Langemyr |
| 2017/0286572 | A1* | 10/2017 | Hershey .................... B64F 5/60 |
| 2018/0137219 | A1* | 5/2018 | Goldfarb ................ G06N 3/126 |
| 2018/0373820 | A1 | 12/2018 | Knezevic |
| 2019/0294978 | A1* | 9/2019 | Sachs .................. G06F 16/2423 |
| 2022/0100916 | A1 | 3/2022 | Knezevic |

OTHER PUBLICATIONS

Antil et al., "Domain decomposition and model reduction for the numerical solution of PDE constrained optimization problems with localized optimization variables," Computing and Visualization in Science, 13(6):249-264, Apr. 1009, 17 pages.
Barbic et al., "Real-time Large-deformation Substructuring," ACM Transaction on Graphics, 30(4) (SIG GRAPH), Vancouver, Canada. Aug. 2011, 7 pages.
Barrault et al., "An 'empirical interpolation' method: application to efficient reduced-basis discretization of partial differential equations," Comptes Rendus Mathematique, 339(9):1667-672, Nov. 2004.
Bermudez et al., "Galerkin lumped parameter methods for transient problems," International Journal for Numerical Methods in Engineering, 87:943-961, Feb. 2011, 19 pages.
Binev et al., "Convergence rates for greedy algorithms in reduced basis methods. Technical report," Aachen Institute for Advanced Study in Computational Engineering Science, Pre-print: AICES 2010/05-2, Oct. 2010, 17 pages.
Bjorstad et al., "Iterative methods for the solution of elliptic problems on regions partitioned into substructures," SIAM Journal on Numerical Analysis, 23(6): 1097-1120 (1986).
Brenner, "The condition number of the Schur complement in domain decomposition," Numerische Mathematik, 83: 187-203 (1999).
Buffa et al., "A priori convergence of the greedy algorithm for the parametrized reduced basis," ESAIM Mathematical Modelling and Numerical Analysis 46 (2012) 595-603.
Chen et al., "A Seamless Reduced Basis Element Method for 2D Maxwell's Problem: An Introduction," Selected papers from the ICOSAHOM '09 conference, Jun. 22-26, 2009, Trondheim, Norway, pp. 141-152.
Craig et al., "Coupling of substructures for dynamic analyses," AIAA Journal, American Institute of Aeronautics, 6(7): 1313-1319 (1968).
D.B.P. Huynh et al., "A Static Condensation Reduced Basis Element Method: Approximation and a Posteriori Error Estimation," Mathematical Modelling and Numerical Analysis, May 26, 2011, 38 pages.

Dymola (Dynamic Modeling Laboratory) User's Manual, Version 5.0, Ideon Research Park, SE-223 70, Lund, Sweden: Dynasim AB, 2003.
Eftang et al., "An 'hp' Certified Reduced Basis Method for Parametrized Elliptic Partial Differential Equations," SIAM Journal on Scientific Computing, 32, pp. 3170-3200, 2010 Society for Industrial and Applied Mathematics.
Ganesh et al., "A Reduced Basis Method for Multiple Electromagnetic Scattering in Three Dimensions," Technical Report, Sep. 2011, Scientific Computing Group, Brown University, Providence, RI, USA, May 2011, 31 pages.
Haggblad et al., "Model reduction methods for dynamic analyses of large structures," Computers and Structures, 47(4-5):735-749, Jun. 1993.
Hurty, "Dynamic analysis of structural systems using component modes," In First AIAA Annual Meeting, No. 64-487 (Jun. 29-Jul. 2, 1964).
Huynh et al., "A successive constraint linear optimization method for lower bounds of parametric coercivity and inf-sup stability constants," Comptes Rendus Mathematique, 345(8):473-478 (2007).
International Preliminary Report on Patentability of Application No. PCT/US2012/033090 dated May 8, 2014, 8 pages.
International Search Report and Written Opinion of Application No. PCT/US2012/033090 dated Jun. 12, 2013, 10 pages.
Kirk et al., "libMesh: A C++ library for parallel adaptive mesh refinement/coarsening simulations," Engineering with Computers, 22(3-4):237-254 (2006).
Knezevic et al., "A high-performance parallel implementation of the certified reduced basis method," Computer Methods in Applied Mechanics and Engineering, 200(13-16): 1455-1466 (2011).
Maday et al., "A priori convergence theory for reduced-basis approximations of single-parameter elliptic partial differential equations," Journal of Scientific Computing, Springer Verlag, 2002, 17 (1-4), pp. 437-446.
Maday et al., "A reduced-basis element method," Journal of Scientific Computing, 17:447-459 (2002).
Maday et al., "The reduced basis element method: application to a thermal fin problem." SIAM Journal on Scientific Computing, 26(1):240-258 (2004).
Nguyen, "A multiscale reduced-basis method for parametrized elliptic partial differential equations with multiple scales," Journal of Computational Physics, 227:9807-9822 (2007).
Non- Final Office Action dated Jul. 11, 2019, in U.S. Appl. No. 15/632,719 of David Knezevic filed on Jun. 26, 2017, 16 pages.
Prud'Homme et al., "Reliable real-time solution of parametrized partial differential equations: reduced-basis output bounds methods," Journal of Fluids Engineering, 124(1):70-80 (2002).
Rozza et al., "Reduced basis approximation and a posteriori error estimation for affinely parametrized elliptic coercive partial differential equations," Archives Computational Methods in Engineering, 15(3):229-275, Sep. 2008.
Schiavo et al., "Object-Oriented Modelling of Flexible Beams," Multibody System Dynamics. Jun. 2006; 15(3):263-286.
Sen, "Reduced basis approximation and a posteriori error estimation for many-parameter heat conduction problems," Numerical Heat Transfer, Part B: Fundamentals, 54(5):369-389 (2008).
Seshu, "Substructuring and component mode synthesis," Shock and Vibration, 4: 199-210 (1997).
Taylor, "Computational Science Module: Analysis of Damaged Panels in Supersonic Flow," Dept. of Computer Science and Engineering Wright State University, Dayton, OH, Oct. 1, 2010.
Zaiczek et al., "Import of Distributed Parameter Models into Lump Parameter Model Libraries for the Example of Linearly Deformable Solid Bodies," 3rd International Workshop on Equation-Based Object-Oriented Languages and Tools, Oct. 2010, 10 pages.
Final Office Action dated Jan. 17, 2020, in U.S. Appl. No. 15/632,719 of David Knezevic filed on Jun. 26, 2017, 10 pages.
Dinh Bao Phuong Huynh et al., "A Static Condensation Reduced Basis Element Method: approximation and a posteriori error estimation," ESAIM: Mathematical Modelling and Numerical Analysis, vol. 47, No. 1, Nov. 23, 2012, pp. 213-251. XP055766977, ISSN: 0764-583X, DOI: 10.1051/m2an/2012022.

(56) References Cited

OTHER PUBLICATIONS

Dr. David Knezevic et al., "Enabling High-Fidelity Digital Twins of Critical Assets Via Reduced Order Modeling," Mar. 7, 2018, XP055766980, 68 pages. Retrieved from the Internet: URL:https://www.ima.umn.edu/materials/2017-2018/SW3.6-8.18/26902/Akselos_Digital_Twins.pdf.
International Search Report and Written Opinion dated Feb. 4, 2021, in international patent application No. PCT/IB2020/060441, 12 pages.
Non-Final Rejection received in U.S. Appl. No. 15/632,719 dated May 1, 2020.
Partha Sharma et al., "OTC-29005-MS RB-FEA Based Digital Twin for Structural Integrity Assessment of Offshore Structures," Paper presented at the Offshore Technology Conference, Houston, Texas, USA, Apr. 2018. Copyright Apr. 30, 2018, XP055767014, Retrieved from the Internet: URL:https://onepetro.org/OTCONF/proceedings-abstract/1 80TC/3-180TC/D031S037R003/179195.
U.S. Appl. No. 17/545,855, filed Dec. 8, 2021.

* cited by examiner

METHODS AND SYSTEMS FOR COMPONENT-BASED REDUCED ORDER MODELING FOR INDUSTRIAL-SCALE STRUCTURAL DIGITAL TWINS

BACKGROUND

The traditional approach to management of industrial machinery and infrastructure from the point of view of structural integrity is to perform extensive analysis at design time to attempt to assess all relevant operational conditions, and based on this analysis to decide on (i) the asset's operational life time, and (ii) a prescriptive scheme (often based on fixed time intervals) for inspection, maintenance, and repair. A key observation in this work is that this design-based prescriptive methodology is fundamentally limited by the large amount of uncertainty about what the true operating conditions of the asset will be. For example, consider the case of a seagoing vessel. The vessel is designed based on assumptions of the environmental conditions (waves, wind, corrosive seawater) and operating conditions (cargo, number and frequency of loading/unloading cycles) to which it will be subjected. But, of course, the future operating conditions are unknown at design time, so the only option is to make conservative assumptions and build in large safety factors to compensate for uncertainty. In practice, when this type of design-time analysis is fully relied upon, this leads to over-design of assets (with corresponding excessive capital expenditure) or premature decommissioning compared to the true capacity of a structure or both. Moreover, even with conservative design assumptions, there is an ever-present risk of unforeseen circumstances during operations that go beyond the "worst case" assumed during design, such as extreme weather, or accidents. Also, there is an increasing movement towards lean design—especially in fields such as renewables where the economic viability of projects is often close to the break-even point where safety margins are limited as much as possible in the interest of reducing costs, which further increases the likelihood of an asset going outside its approved operating envelope. This brings health and safety risks and may also lead to damage that shortens asset lifetime or necessitates expensive remedial interventions. Therefore, there is a need for solutions that provide modeling of conditions and recommendations for maintenance and safety throughout a physical asset's operational lifetime.

BRIEF SUMMARY

In one aspect, a method for maintaining a physical asset based on recommendations generated by analyzing a model of the physical asset, the model comprising a plurality of components and forming a physics-based digital twin of the physical asset, includes constructing, by a computing device, using a port-reduced static condensation reduced basis element approximation of at least a portion of a partial differential equation, a composite model of a plurality of models, each of the plurality of models representing at least one of a plurality of components, each of the plurality of components representing at least one region of a physical asset. The method includes analyzing, by the computing device, for at least one model in the plurality of models, an error indicator identifying a level of error associated with the at least one model, to determine that the identified level of error exceeds a tolerance level. The method includes increasing, by the computing device, a number of basis functions in the port-reduced static condensation reduced basis element approximation, based upon a determination that the at least one model has a level of error exceeding the tolerance level. The method includes repeating the error analysis and increasing of basis functions for each model in the plurality of models until the level of error for each of the plurality of models is beneath the tolerance level. The method includes receiving, by the computing device, from a first operational data source associated with the physical asset, first operational data associated with at least one region of the physical asset represented by at least one parameter of at least one component in the plurality of components. The method includes updating, by the computing device, the composite model, based upon the received first operational data. The method includes providing, by the computing device, a recommendation for maintaining the physical asset, based upon the updated composite model.

BRIEF DESCRIPTION OF THE DRAWINGS

The foregoing and other objects, aspects, features, and advantages of the disclosure will become more apparent and better understood by referring to the following description taken in conjunction with the accompanying drawings, in which.

DETAILED DESCRIPTION

Figure 1A:
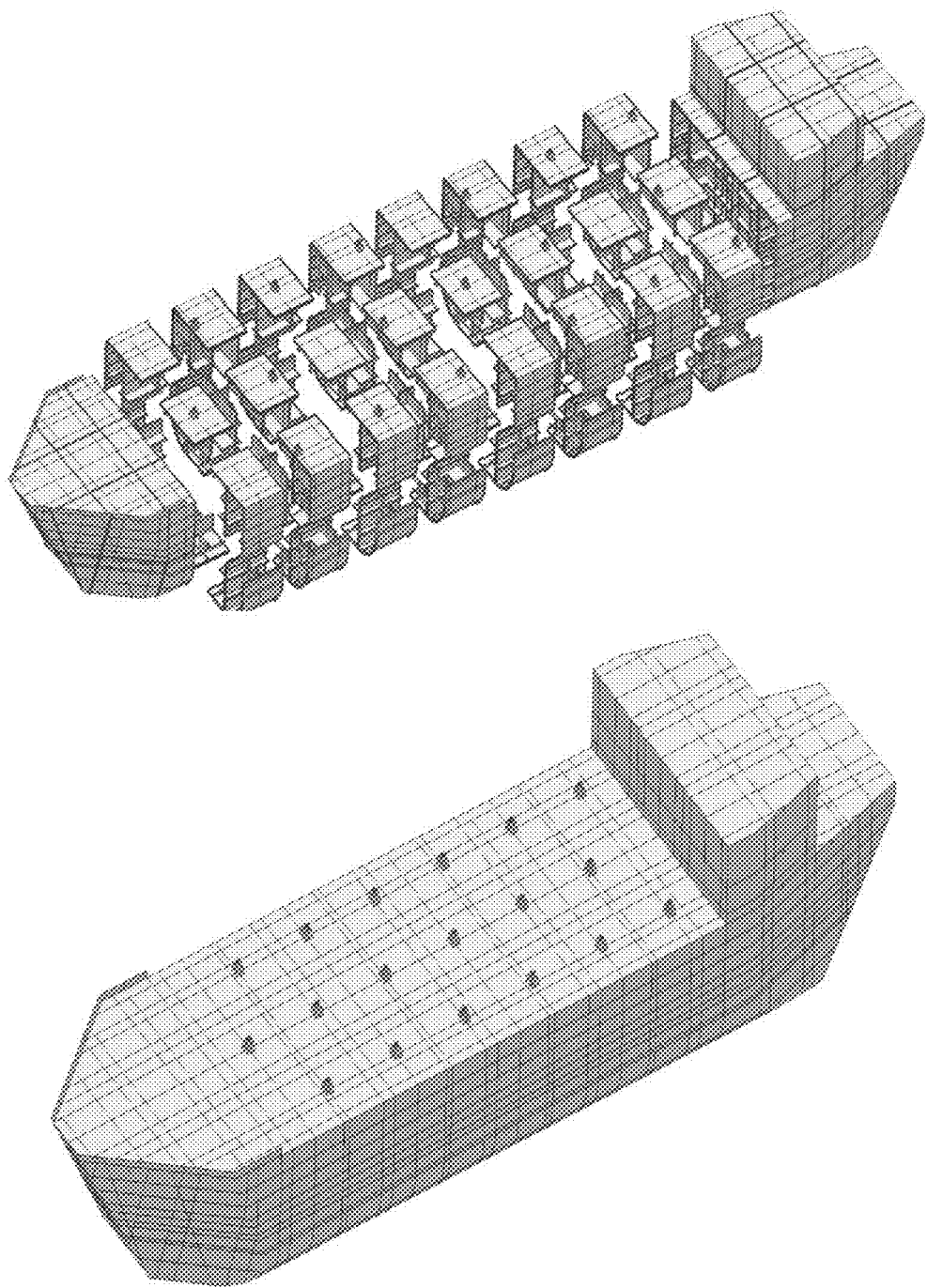
FIG. 1A is an illustration depicting how a system-level finite element model may be obtained by connecting a plurality of components.

The methods and systems described herein provide functionality for maintaining a physical asset based on recommendations generated by analyzing a model of the physical asset, the model comprising a plurality of components and forming a physics-based digital twin of the physical asset. In addition to maintaining the physical asset, the methods and systems described herein may provide functionality for identifying one or more aspects of the physical asset that should be inspected (e.g., subject to a physical inspection). In addition to maintaining the physical asset, the methods and systems described herein may provide functionality for determining a level of feasibility of a proposed modification to the physical asset. In addition to maintaining the physical asset, the methods and systems described herein may provide functionality for determining a level of operability of the physical asset.

The methods and systems described herein may provide functionality for performing structural integrity monitoring and reassessment during operation, which may enable identification of extra capacity present in the asset (and hence may avoid early decommissioning) or overly onerous maintenance regimes, while also tracking the impact of extreme or unpredictable events to ensure safety and reliability. In some embodiments, this goal of asset tracking and integrity monitoring during operations motivates the concept of a structural digital twin. The term digital twin may refer to a computational replica of a physical asset which is kept in sync with the asset during its operational lifetime, based on inspection and sensor data, for example. A structural digital twin may refer to the specific case in which the purpose of the digital twin is to assess structural integrity based on the "as is" state of the asset. Updates to a structural digital twin may capture any structurally relevant changes to the asset, and can be based on, for example, inspection data (e.g. visual inspection, ultrasound thickness measurements, laser scans) or sensor measurements (e.g. accelerometers, strain gauges, environmental monitoring). This inspection and instrumentation significantly reduces, if not eliminates, the uncertainty associated with operating conditions since it allows for continuous updates the digital twin to reflect the true state of the asset and its environment. Through this approach, users of the methods and systems described herein may therefore develop updated asset management plans informed by the structural digital twin (e.g. for inspection, maintenance, repair, changes to allowable operating conditions, damage or accident response, or asset life extension) instead of relying on the plans that were developed at design-time. Furthermore, it should be noted that structural digital twins may be provided for physical assets within industrial systems, such as fixed or floating offshore structures, aircraft, mining machinery, rotating machinery, or pressure vessels. The methods and systems described herein, therefore, include a component-based reduced order modeling framework based on the Static Condensation Reduced Basis Element (SCRBE) method that enables fast, holistic, detailed, and parametric structural analysis of large-scale industrial systems. This methodology supports modeling needs of structural digital twins, where a structural digital twin is a detailed physics-based model of a structural system that tracks the "as is" state of the system over its operational lifetime. A range of numerical examples will be discussed in further detail below that illustrate the unique capabilities of the SCRBE approach to incorporate inspection and/or sensor data, efficiently perform detailed structural integrity analysis, and enable post-processing and report generation to support data-driven decision-making during operation of critical structural systems.

The methods and systems described herein provide functionality for generating and updating structural digital twins that satisfy four properties: holistic and detailed modeling, speed, parametric modeling, and standards compliance and certifiable accuracy.

Structural digital twins should enable "screening" of an entire system to identify the most likely "failure locations," e.g. at stress and fatigue hotspots, so that these locations can be prioritized in inspection planning, for example. In order to enable this type of screening, a holistic and detailed model is used, in order to accurately resolve the stress throughout the components of the physical asset. In order to gain maximum insight from inspection data and sensor data, a structural digital twin should represent an entire asset as one holistic model, and should provide a sufficient level of detail such that all relevant data can be mapped in an accurate manner into the digital twin. Through this approach the digital twin may capture the local, non-local, and cumulative effects of all updates (e.g. modifications, defects, damage) that have been measured or observed. This is an aspect of an assessment of the "as is" state of the asset that allows the system to ensure that the accumulated effect of all of the updates to date does not lead to new and unexpected stress hotspots or predicted failure modes. Holistic and detailed modeling is also desirable from the point of view of workflow efficiency, in the sense that a model that incorporates all up-to-date asset data in detail provides a "single source of truth" on the current state of the asset, and avoids the need to manage a multitude of separate localized models.

A status report from a structural digital twin typically involves solving thousands of different load cases, e.g., to perform a fatigue life estimation of critical parts, or to perform a strength check based on the relevant industry standards under a wide range of "what if" scenarios. In order for an operator to be able to use the digital twin to inform data-driven decision-making, the full battery of analysis results need to be completed quickly enough so that the status report is available in time for the decision-making process. Therefore, the methods and systems described herein provide functionality for generating and updating structural digital twins within a timeframe required for the generated or updated structural digital twin to inform decision making.

An aspect of a structural digital twin is that it may evolve (and in some embodiments continuously evolves), either based on the updated state of the asset, or due to modifications imposed by the operator who may want to assess different proposed changes or "what if" scenarios. Therefore, the methods and systems described herein provide functionality for generating and updating structural digital twins that are readily and efficiently modifiable. A parametric modeling approach may facilitate such modifications, since parametric modeling enables properties to be modified via changing "dials," e.g. to vary stiffnesses, densities, loads, geometry, etc., and to be re-solved automatically and efficiently. Parametric modeling also facilities uncertainty quantification since model parameters can be statistically sampled in order to assess uncertainty in the digital twin's predictions, such as assessment structural fatigue under a range of loading scenarios or corrosion rates. This type of statistical uncertainty analysis allows for risk-based planning of asset management based on a digital twin.

Structural digital twins are typically deployed for safety critical and high-value assets, and there are many existing codes from regulators and standards bodies that govern the type of analysis that should be used in this context. Therefore, the methods and systems described herein provide functionality for generating and updating structural digital twins that comply with these standards in order for regulators and operators to have full confidence in the results it provides while providing analysis results that may be checked to confirm their accuracy and reliability.

One conventional tool for structural integrity analysis of industrial equipment is the Finite Element (FE) method. FE certainly satisfies requirements around standards compliance and certifiable accuracy, but it has significant limitations for the other three items. Regarding holistic and detailed modeling and speed, the computational speed and memory requirements of FE typically grow superlinearly with the number of degrees of freedom, and hence in most practical circumstances detailed and holistic modeling is not feasible for large-scale systems with FE. This issue with FE has led to the development of many submodeling-based workflows (coarse global models and separate fine local models), but the submodeling approach ignores the non-local and cumulative effects we aim to capture when performing an update to a structural digital twin. Regarding parametric modeling, FE is not inherently parametric, in the sense that any parametric change requires a new (often computationally intensive) solve to be performed from scratch.

Artificial intelligence and machine learning (AI/ML), and related methods such as response surfaces, are another set of candidate methodologies that are often promoted for digital twins. AI/ML enables fast analysis of systems, typically by evaluating specific quantities of interest (QoIs) as a function of parameters. As a result, AI/ML covers items speed and parametric modeling well, but it falls short on the remaining two items. For holistic and detailed modeling, evaluation of specific quantities of interest is not consistent with the concept of a holistic and detailed model in which all details of an asset should be fully represented, since the specific QoI outputs do not provide a picture of the entire asset. For standards compliance and certifiable accuracy, AI/ML models are well-known to be "black boxes" which are difficult to interpret, and which are not based on first principles of physics or compliant with physics-based asset integrity standards.

There is a wide range of reduced order modeling (ROM) methods that have been developed and which could be candidates for the type of structural digital twin discussed above, including Parabolic Orthogonal Decomposition (POD), Proper Generalized Decomposition (PGD), or Certified Reduced Basis Method; ROMs certainly provide speed, and—depending on the ROM type—may also provide parametric modeling and certifiable accuracy. However, the ROMs generally do not enable holistic and detailed modeling of large-scale systems; therefore, they do not typically provide a methodology that will apply to the largest industrial systems, e.g. equivalent to more than $10^8$ FE degrees of freedom, as required for fully detailed models of large-scale floating structures, or aircraft, for example. The ROM approaches mentioned above are not well-suited to this type of large-scale model, since ROMs need to be "trained" by solving the full order model many times for different configurations, and this is prohibitively expensive when the full-order model is very large-scale.

Therefore, the methods and systems described herein provide a component-based ROM approach based on the Static Condensation Reduced Basis Element (SCRBE) framework. The SCRBE methodology builds on the Certified Reduced Basis Method to provide a physics-based ROM of parametric partial differential equations (PDEs). As is typical for ROM approaches, SCRBE involves an Offline/Online decomposition in which the model data is "trained" during the Offline stage, and subsequently evaluated for specific parameter choices during the Online stage. The Offline stage is computationally intensive, but once it is complete the Online stage may be evaluated very quickly (typically orders of magnitude faster than a corresponding FE solve) for any new parameter choices within a pre-defined range. The key aspect of the methodology that differentiates it from the ROM methods discussed above, however, is that it is component-based, in the sense that the overall system is decomposed into smaller components and a separate ROM is trained for each component. This enables greater scalability than other approaches since with SCRBE the system does not need to solve the entire system with a full order (e.g. FE) solver during the Offline stage—it is sufficient to solve isolated components and local subsystems in order to generate the training data. The resulting ROM for each component consists of reduced order representations of both the component interior (via the standard Reduced Basis method) and the component interfaces via "port reduction". The baseline SCRBE method applies to linear PDEs since the formulation leverages static condensation, but it can be naturally extended to incorporate nonlinearities by including nonlinear FE regions in the model where needed. Such a SCRBE framework addresses all four of the properties of structural digital twins described above.

While the methods and systems described herein focus on structural digital twins based on the SCRBE methodology, in some embodiments, these methods and systems are combined with functionality for SCRBE, FE, and/or AI/ML. Therefore, the methods described herein may include receiving output from an AI/ML system and incorporating that output into the analyses; such methods may include providing output back to the AI/ML system with which the AI/ML system may automatically improve its subsequent execution. In particular, AI/ML, may be highly effective as a "canary" in that it can generate a potential "red flag" quickly based on specific QoIs during operations, and then SCRBE may be applied for a fully-detailed analysis to assess the red flag scenario in more detail and prescribe further action if needed. Another combination of SCRBE and AI/ML uses SCRBE to generate physics-based data that can be used to augment real-world measurements, and then the augmented datasets can be used to train a richer AI/ML model. This is particularly important in order to enable an AI/ML model to accurately classify rare behavior (such as failures, which are typically rare on well-managed assets) since the real-world datasets on rare events is by definition limited. To address this issue, physics-based ROMs such as SCRBE can be used to efficiently generate a wide range of failure mode data by simulating specific failure scenarios and extracting virtual sensor readings in order to augment and enrich AI/ML training sets. Similarly, SCRBE and FE complement each other well since SCRBE enables fast and parametric modeling of large-scale systems, which can be used to identify localized regions in the system which may have structural integrity issues. Once a region is identified, it can be subjected to extensive localized FE analysis to perform further assessment and since SCRBE is based on FE meshes, the system may run FE using any subset of the components in an SCRBE model.

Although the structural digital twins considered in this work have SCRBE at their core, there is an extensive layer of pre-processing and post-processing required in order to provide a complete workflow that is useful to operators who manage critical systems on a day-to-day basis. Such a system should automatically and seamlessly update a structural digital twin based on new data, and generate reports that summarize key findings on demand. This flow from updated data to a digital twin to new reporting and recommendations is often referred to as a "digital thread," where the "thread" connects all relevant parts of the digital asset integrity framework. Examples of a digital thread—built around SCRBE-based structural digital twins—for physical assets are described in greater detail below.

Component-based modeling has long been a standard approach to analysis of large-scale structural systems. The starting point of a component-based formulation is typically to define a set of $n_{comp}$ components, where component i corresponds to a spatial domain $\Omega_i$ and contains a set of interface surfaces—that we refer to as ports—on which component i can be connected to neighbor components. Let $n_{port}$ denote the total number of connected ports in an overall system. Based on this component/port framework, the equivalent system-level FE model may be obtained by connecting the components to form the domain $\Omega = \cup n_{i=1}^{n_{comp}} \Omega_i$, as illustrated in FIG. 1. As shown in FIG. 1, components from a hull (top) are assembled into a fully connected system-level model (bottom). The SCRBE approach to developing parametric ROMs that leverage the component-based decomposition of system-level models introduced above will be described in greater detail below.

Let the system:

$$KU=F, \qquad (1)$$

denote an equilibrium structural analysis FE problem (after discretization based on a finite element space has been applied) posed on $\Omega$, such as static or quasi-static linear elasticity. Here $K \in \mathbb{R}^{N_{FE} \times N_{FE}}$ is the (symmetric) stiffness matrix, $U \in \mathbb{R}^{N_{FE}}$ is the displacement vector, and $F \in \mathbb{R}^{N_{FE}}$ is the load vector, where $N_{FE}$ denotes the number of FE degrees of freedom (DOFs) in the FE discretization on $\Omega$. The system of (1) may be referred to as the standard FE formulation of this problem, and in the context of ROMs this is often referred to as the "truth" formulation.

Regarding the role of components, and for the sake of illustration, in a highly simplified case with $n_{comp}=2$ and $n_{port}=1$, the system-level domain is $\Omega = \Omega_1 \cup \Omega_2$, and p denotes the single port that connects $\Omega_1$ and $\Omega_2$. Let $N_{FE,1}$ and $N_{FE,2}$ denote the number of FE DOFs associated with the interior (non-port) region of components 1 and 2, respectively, and let $N_{FE,p}$ denote the number of FE DOFs on μ. Note that the DOFs on p may be standard FE Lagrange basis functions associated with individual nodes in the FE mesh, or they may be general functions that have support on the entire port—the latter case is necessary in the case of "port reduction," which will be discuss in greater detail below. Then (1) may be rewritten in the block form:

$$\begin{bmatrix} K_{p,p} & K_{p,1} & K_{p,2} \\ K_{p,1}^T & K_{1,1} & 0 \\ K_{p,2}^T & 0 & K_{2,2} \end{bmatrix} \begin{bmatrix} U_p \\ U_1 \\ U_2 \end{bmatrix} = \begin{bmatrix} F_p \\ F_1 \\ F_2 \end{bmatrix}. \qquad (2)$$

The matrix structure here suggests solving for $U_1$ and $U_2$ in terms of $U_p$ as follows:

$$U_i = K_{i,i}^{-1}(F_i - K_{p,i}^T U_p), i=1,2. \qquad (3)$$

Substitution of (3) into (2) then yields a system with only $U_p$ as unknown:

$$K_{p,p} U_p + \Sigma_{i=1}^2 K_{p,i} K_{i,i}^{-1} (F_i - K_{p,i}^T U_p) = F_p, \qquad (4)$$

or equivalently $$(K_{p,p} - \Sigma_{i=1}^2 K_{p,i} K_{i,i}^{-1} K_{p,i}^T) U_p = F_p - \Sigma_{i=1}^2 K_{p,i} K_{i,i}^{-1} F_i. \qquad (5)$$

The following notation may be used for the substructured stiffness matrix and load vector:

$$\mathbb{K} = (K_{p,p} - \Sigma_{i=1}^2 K_{p,i} K_{i,i}^{-1} K_{p,i}^T), \mathbb{F} = F_p - \Sigma_{i=1}^2 K_{p,i} K_{i,i}^{-1} F_i, \qquad (6)$$

where $\mathbb{K} \in \mathbb{R}^{N_{FE,p} \times N_{FE,p}}$, and $\mathbb{F} \in \mathbb{F}^{N_{FE,p}}$. Hence:

$$\mathbb{K} U_p = \mathbb{F} \qquad (7)$$

Here (7) is an exact reformulation of (1), where the key point is that by performing a sequence of component-local solves as in (3) the system is reduced to size $N_{FE,p} \times N_{FE,p}$ instead of the original size $N_{FE} \times N_{FE}$. This procedure is referred to by a number of different names in the literature, such as substructuring, superelements, static condensation or block Gaussian elimination. The name substructuring may be used to refer to this approach.

The approach in (2)-(5) relies on the linearity of (1), and hence the component-based formulation discussed in this section is linear-only. Approaches that apply to nonlinear analysis are discussed in greater detail below.

In order to implement (2)-(5) efficiently, in one embodiment, there is no explicitly computation of $K_{i,i}^{-1}$. Instead, (3) is re-written as a sequence of $N_{FE,p}+1$ solves—one for each DOF on port p plus one for $F_i$—as follows:

$$K_{i,i} X_i^F = F_i, K_{i,i} X_i^j = -K_{p,i}^T e_j, j=1, \ldots, N_{FE,p}, \qquad (8)$$

where $e_j$ is the canonical unit vector in $\mathbb{R}^{N_{FE,i}}$ with 1 in the jth entry, and once we have completed this sequence we can reconstruct $K_{i,i}^{-1} F_i$ and $K_{i,i}^{-1} K_{p,i}^T$, and hence obtain the terms in (5) via pre-multiplication of $K_{p,i}$. The X vectors in (8) have no physical meaning, their role is only to be used in the assembly of $\mathbb{K}$ and $\mathbb{F}$.

In the derivation above we assumed that $n_{comp}=2$ and that there was only one port p, but everything generalizes naturally to the case of any number of components and ports. As a result, below we shall understand $N_{FE,p}$ to refer to the number of FE DOFs on all ports in the system.

The substructuring approach described above is widely used, and affords some attractive computational efficiencies and conveniences. One advantage, as noted above, is that the system in (5) is typically considerably smaller than the system in (1). Another advantage is that if a change is made within component i, in order to assemble the updated $N_{FE,p} \times N_{FE,p}$ stiffness matrix and load vector we only need to solve (3) for component i rather than for all components, hence local changes to the component-based system can be performed in an efficient component-local manner. While these advantages are attractive in some cases, in general the computational advantages of substructuring compared to the standard FE formulation in (1) are quite limited due to two key issues. First, the procedure described above for incorporating a change within a component is indeed modular, but it can be onerous since each change to a component requires a new component-local FE solves to be performed. In practice this may be costly, especially in the case that many updates are required (e.g. when modifications are performed to match real-time sensor measurements, or within the inner loop of an optimization), or when we use highly resolved component meshes. Second, the $N_{FE,p} \times N_{FE,p}$ matrix $\mathbb{K}$ is indeed smaller than (1) since the interior DOFs have been condensed out, but in general (in the case that $n_{comp}>2$) it is block-sparse with potentially large and dense blocks with sizes corresponding to the number of port DOFs on component interfaces. Due to the extra density in this matrix structure in many cases of interest it may require similar or even more computational resources to solve (7) than the original sparse FE system (1). This is a well known issue with sub structuring, and the usual advice to address this is to make sure that ports contain as few DOFs as possible (e.g. by locating ports in regions that are small, or coarsely meshed) to limit the size of the dense blocks. In practice these requirements impose very severe limitations on the application of sub structuring, and in many cases (depending on the model geometry or mesh density) it is not possible for the requirements to be satisfied.

The essence of the difficulty here is that substructuring is not a ROM. Instead, as noted above, it is an exact reformulation of the original FE problem. This ensures the retention of full accuracy in the analysis, but on the other hand limitations (possibly severe) due to the computational issues noted above. The methods and systems described herein, therefore, develop a ROM formulation that builds on the substructuring approach in order to address the computational limitations of the standard substructuring approach. In particular the goal here (as with any ROM approach) is to introduce a small extra approximation compared to the non-reduced approach in return for a large computational advantage. In order to address the first issue listed above, in one embodiment, we develop component-local parametric ROMs using the Certified Reduced Basis (RB) Method in order to replace the FE solves from (3) with parametrized RB solves. We introduce the parameter vector $\mu \in \mathcal{D} \subset \mathbb{R}^D$, which encodes the parametrized properties in each component, such as stiffnesses, shell thicknesses, densities, impedances, loads, or geometry. The parameter domain $\mathcal{D}$ defines the min/max value of $\mu_i$, i=1, . . . ,D, and according to the RB framework this domain is set prior to performing the RB greedy algorithm in the Offline stage since the RB greedy algorithm will sample parameters within $\mathcal{D}$. In all subsequent developments here and in the sections below we shall assume that the systems under consideration are parametrized by $\mu$. Then we create an RB representation for each component so that we may replace the component-interior FE solves—one solve per port DOF, as noted in remark 2.1)—with component-interior parametric RB solves. The first step in this process is to introduce the affine expansion on component i as follows:

$$K_{i,i}(\mu) = \Sigma_{q=1}^{QA} \theta_i^{K,q}(\mu) K_{i,i}^q, (K_{p,i}(\mu))^T = \Sigma_{q=1}^{QA} \theta_i^{K,q}(\mu)$$
$$(K_{p,i}^q)^T, F_i(\mu) = \Sigma_{q=1}^{QF} \theta_i^{F,q}(\mu) F_i^q, \qquad (9)$$

where we separate into parameter-dependent functions (i.e. the θs) and parameter-independent operators (i.e. the K matrices and F vectors)—this is crucial for the RB method's Online efficiency, as discussed below. We can then use (9) to reformulate the sequence of solves from (8) on component i as follows:

$$\Sigma_{q=1}^{QA} \theta_i^{K,q}(\mu) K_{i,i}^q X_i^F(\mu) = \Sigma_{q=1}^{QF} \theta_i^{F,q}(\mu) F_i^q,$$
$$\Sigma_{q=1}^{QA} \theta_i^{K,q}(\mu) K_{i,i}^q X_i^j(\mu) = -\Sigma_{q=1}^{QA} \theta_i^{K,q}(\mu) (K_{p,i}^q)$$
$$T_{e_j}, j=1, \ldots, N_{FE,p}. \qquad (10)$$

Next, we generate an "RB space" for each of the $N_{FE,p}+1$ parametric equations in (10). This is performed during the "Offline" stage using a RB greedy algorithm to generate a set of reduced basis functions that accurately represent the full range of solutions for each of the equations in (10) over the entire parameter domain $\mathcal{D}$. The RB greedy algorithm achieves this by using residual-based a posteriori error bounds in order to guide adaptive sampling in parameter space in order generate efficient RB models that are accurate over the entire parameter domain of interest.

This results in $N_{FE,p}+1$ RB bases. In particular, let $Z_{RB}^i \in \mathbb{R}^{N_{FE,i} \times N_{RB,i}}$ denote an "RB basis function matrix" for component i, where $N_{RB,i}$ denotes the number of RB basis functions, and column j of $Z^i$ is the jth basis function. We can then "reduce" the parameter-independent operators from (10) as follows:

$$K_{i,i}^{q,RB} = (Z_{RB}^i)^T K_{i,i}^q Z_{RB}^i \in \mathbb{R}^{N_{RB,i} \times N_{RB,i}}, F_i^{q,RB} = (Z_{RB}^i)$$
$$T_{F_i^q} \in \mathbb{R}^{N_{RB,i}}, \qquad (11)$$

and these reduced operators are stored to subsequently be used during Online solves. Typical sizes of $N_{FE,i}$ and $N_{RB,i}$ could be $O(10^5)$ and $O(10)$, respectively, hence (11) represents a reduction from large sparse matrices to very small dense matrices, as is familiar from the RB framework.

In the "Online" stage, to assemble the contribution from each component's interior, the pre-stored reduced operators from (11) are combined with the θs,—evaluated at the Online-requested parameter vector $\mu$—to assemble and solve the reduced system for any particular $\mu$ of interest. This assembly and solve is very fast since it depends only on quantities of size $N_{RB,i}$, not $N_{FE,i}$. This Online independence from $N_{FE,i}$ is referred to as the Offline/Online decomposition of the RB method, and it is enabled by the affine expansion from (10). In the context of SCRBE, the Offline/Online decomposition enables us to quickly reassemble the system (5) after parametric properties within any component (or all components simultaneously) are modified, which directly addresses the first issue above.

The empirical interpolation method (EIM) can be applied in order to enable an approximate affine decomposition even in cases where an exact affine decomposition is not available. This is often used in practice to enable certain types of complicated parametrizations including geometric mappings that "morph" a component's shape.

It is well known in the context of parametric ROMs in general, and the RB method in particular, that the Offline and Online computational cost of ROMs generally increases rapidly as the number of parameters increases—this is the so-called "curse of dimensionality." However, the SCRBE framework circumvents this issue via component-based localization of RB greedies and parameters: the RB greedy algorithm on component i only involves the subset of parameters that affect component i. This means we can set up large systems with many (e.g. thousands) of parameters without being affected by the "curse of dimensionality" since the system-level model can be built from many components where each component only has a few parameters.

Regarding the second issue above, we note that the source of the computational difficulty is that conventional substructuring uses, in the notation of (2), $N_{FE,p}$ DOFs on the ports. The natural solution to this issue is to reduce the number of DOFs on the ports by developing ROMs for the port DOFs. This process of developing "port ROMs" is referred to in the SCRBE literature as "port reduction" (In some articles, "SCRBE with port reduction" is abbreviated as "PR-SCRBE," but in this work we assume that we always apply port reduction, and hence we use the shorter name "SCRBE" throughout.) We utilize various port reduction schemes from the literature, such as pairwise training and empirical modes, which involves port-based model reduction via proper orthogonal decomposition (POD), or "optimal modes," which solves a transfer eigenproblem to obtain an optimal set of port DOFs. The goal of these schemes is to construct a reduced set of $N_{PR,p}(\gg N_{FE,p})$ DOFs on each port, while retaining accuracy compared to a full order solve by ensuring that the dominant information transfer between adjacent components is captured efficiently by the reduced set of port DOFs. Also, port reduction schemes operate based on small submodels of an overall system during the Offline stage, so there is no need to perform a full order system-level solve.

The reduced set of port modes means that instead of (7), we obtain a system:

$$\tilde{\mathbb{K}}(\mu) \tilde{U}_p(\mu) = \tilde{\mathbb{F}}(\mu). \qquad (12)$$

of size $N_{PR,p} \times N_{PR,p}$, where $\tilde{\mathbb{K}}$ is also less dense than $\mathbb{K}$ due to the reduced size of the dense blocks. (Note that we also include the parameter dependence in (12) now, due to the RB formulation on component interiors, as introduced above.) Furthermore, port reduction reduces the Offline and Online cost associated with the RB approximations on component interiors, since we replace $N_{FE,p}$ in (10) with $N_{PR,p}$.

Port reduction vastly increases the applicability of the substructuring framework since we may use ports of any shape or size and locate them anywhere in a model, and as long as we can generate an effective ROM for the ports we will be able to solve the overall model efficiently. In particular, using SCRBE with port reduction for large-scale models we typically obtain orders of magnitude speedup compared to a standard FE solve, whereas with standard sub structuring in many cases the solve time for the substructured system is comparable to, or even slower than, the solve time for the standard FE solve, as was noted above.

Perhaps more important than speedup compared to conventional FE, though, is the scalability that SCRBE with port reduction brings. The computational cost of solving large-scale structural models with FE of course grows as a function of $N_{FE}$, where the growth rate depends on the preconditioner type, solver type, and condition number of K. In practice most structural problems associated with industrial systems involve ill-conditioning in one form or another, e.g. shell elements, slender solid elements, rigid connectors, or stiff beams, and this ill-conditioning means that it is highly unlikely that iterative solvers with preconditing such as the preconditioned conjugate gradient method, or GMRES, or algebraic multigrid methods, will converge. Sparse direct solvers are reliable solvers for FE formulations for the types of problems shown below. One advantage of a direct solver is that it avoids any convergence issues, but one disadvantage is that it presents significant scalability issues for large-scale problems—especially associated with memory requirements. In contrast, as described below, SCRBE with port reduction enables efficient solving of very large-scale models while avoiding convergence difficulties, since—as noted above—it does not require the performance of full order solves at the system level during the Offline stage, and in the Online stage a reduced system may be constructed consisting only of port-reduced-DOFs that is small enough to be solved quickly and efficiently with a direct solver. Hence SCRBE resolves a major computational limitation that is present with conventional FE solvers for large-scale structural problems. To summarize, therefore, the SCRBE framework presented here combines the RB method on component interiors and port reduction on component interfaces in order to resolve both the first and second issues described above. This enables fast, detailed, and parametric analysis of large-scale systems, which is a set of capabilities that are ideally suited to structural digital twins of industrial systems.

Another problem class of significant relevance to structural digital twins is frequency-domain analysis of forced vibration, such as Helmholtz acoustics or Helmholtz elastodynamics. In this case the FE system takes the form $$(K(\nu)-\omega^2 M(\nu))U(\omega,\nu)=F(\omega,\nu), \qquad (13)$$

where now M denotes the FE-discretized mass matrix, $\omega$ is the frequency, and U is a complex-valued solution vector that represents, for example, the pressure (acoustics) or structural response (elastodynamics). In (13), let $\nu$ denote the user-specified parameter vector (e.g. material properties, geometry, loading, impedances), and then the full parameter vector $\mu$, as above, is given by $\mu=(\omega, \nu)$. Let $H(\mu)=K(\nu)-\omega^2 M(\nu)$, so that we can rewrite (13) as:

$$H(\mu)U(\mu)=F(\mu). \qquad (14)$$

One could apply the standard sub structuring framework (2)-(5) to (14) using the same approach as described above, and with the same drawbacks as identified in the first and second issues. The issue of extra density in matrix structure is just as restrictive here as above, while the issue of cost when components change is typically much more restrictive in the frequency-domain case because it is very rare that an evaluation of (14) for a single frequency is sufficient—typically the goal of a frequency-domain analysis is to perform a "sweep" over a frequency range.

The SCRBE framework introduced above can once again be deployed to resolve these issues. This brings all the same benefits as above, and also ensures that we can perform highly efficient frequency sweeps with (14) since the frequency $\omega$ is incorporated into the SCRBE parametric ROM in a natural way—it is simply treated as one of the entries of the parameter vector $\mu$.

The SCRBE framework can be applied almost unchanged to (14). One difference is that now we develop an affine expansion of $H(\mu)$ instead of $K(\mu)$, but this follows straightforwardly from the approach introduced above, since the only extra requirement is that we must also create an affine expansion of the mass matrix on each component, as follows:

$$\omega^2 M_{i,i}(\nu)=\Sigma_{q=1}^{Q_M}\theta_i^{M,q}(\mu)M_{i,i}^q, i=1,\ldots,n_{comp}. \qquad (15)$$

Also, in order to ensure that all component interior solves from (3) are stable we must impose a limit on the parameter range of $\omega$ such that $\omega \in [0, \lambda_{comp})$, where $\lambda_{comp}$ denotes the smallest eigenvalue over all components in the model of the generalized eigenvalue problem, i.e. $\lambda_{comp}=\min_{i=1}^{n_{comp}} \min_{\mu \in D} \lambda_i^1(\nu)$, where $$K_{i,i}(\nu)V_i^j(\nu)=\lambda_i^j(\nu)M_{i,i}(\nu)V_i^j(\nu), j=1,\ldots,N_{FE,i}, \qquad (16)$$

and where we assume that the eigenvalues are ordered such that $\lambda_i^1(\nu) \leq \lambda_i^2(\nu) \leq \ldots \leq \lambda_i^{N_{FE,i}}(\nu)$. This restriction guarantees stability of the component-local solves because below $\lambda_{comp}$ the Helmholtz equation isolated to each component is coercive, whereas above $\lambda_{min}$ we face instability as the inf-sup constant decays to zero at resonances. It is important to note, however, that the maximum imposed on $\omega$ by $\lambda_{comp}$ is usually not very restrictive in the context of system-level eigenvalues and eigenmodes, since typically individual components are small compared to the overall system so $\lambda_{comp}$ typically corresponds to a high-frequency at the system level. Once an SCRBE model is created and trained for a frequency-domain problem, typically we can perform a fast "sweep" over a wide range of frequencies with dense sampling in $\omega$ in order to resolve complicated vibrational responses with high accuracy.

Next, let us consider the parametrized dynamic model:

$$M(\mu)\ddot{U}(\mu,t)+C(\mu)\dot{U}(\mu,t)+K(\mu)U(\mu,t)=F(\mu,t), \qquad (17)$$

which denotes the equation of motion of a structural system, after FE discretization has been applied spatially, where C is the damping matrix, and now the displacement field $U(\mu, t) \in \mathbb{R}^{N_{FE}}$ is a function of time. One can then discretize in time and apply standard explicit or implicit time-marching schemes in order to solve this system, but this may be a highly computationally intensive approach, especially for large-scale systems. As a result, a common alternative is to solve for the first $N_{modes}$ eigenvalue/eigenmode pairs of the corresponding eigenvalue problem (where typically $N_{modes} \ll N_{FE}$)

$$K(\mu)\bar{V}^j(\mu)=\lambda^j(\mu)M(\mu)\bar{V}^j(\mu), j=1,\ldots,N_{modes}, \qquad (18)$$

and then we represent the dynamic solution via modal superposition on the truncated set of eigenmodes:

$$U(\mu,t)=\Sigma_{j=1}^{N_{modes}} W_j(\mu,t)\bar{V}^j(\mu), \qquad (19)$$

where $W(\mu, t) \in \mathbb{R}^{N_{modes}}$ is the coefficient vector. Equivalently we can write $U(\mu, t)=v(\mu)W(\mu, t)$, where $v(\mu) \in \mathbb{R}^{N_{FE} \times N_{modes}}$ denotes the matrix in which column j is the eigenvector $V^j(\mu)$. We substitute (19) into (17) and apply orthogonality of eigenmodes with respect to $M(\mu)$ to obtain:

$$\ddot{W}(\mu,t)+(v(\mu))^T C(\mu)v(\mu)\dot{W}(\mu,t)+\Lambda(\mu)W(\mu,t)=(v(\mu))^T F(\mu,t), \quad (20)$$

where $\Lambda(\mu)=\text{diag}(\lambda_1(\mu), \ldots, \lambda N_{modes}(\mu))$. (20) is a system of $N_{modes}$ ODEs that—if $N_{modes}$ is large enough—generally captures the global dynamics of the system well.

However, if the structural system is large and/or complex, it may not be computationally feasible to solve the global eigenproblem (18). As a result, component-based model reduction frameworks have been extensively developed in order to enable efficient calculation of (18) and hence (20). The most widely known approach is the Craig-Bampton method, in which we form a reduced set of DOFs on each component based on (i) interface constraint modes, which are identical to the $X_i^j$ from (8), and (ii) a set of $\ell$ fixed-interface normal modes, which are obtained via a component-local eigenproblem with zero constraints imposed on all ports. The combination of (i) and (ii) corresponds to replacing $U^i \in \mathbb{R}^{N_{FE,i}+N_{FE,p}}$ on component i with the "generalized coordinates" $\xi^i \in \mathbb{R}^{\ell+N_{FE,p}}$ as follows:

$$U^i = \begin{bmatrix} \Phi_\ell^i(\mu) & -K_{i,i}(\mu)^{-1}(K_{p,i}(\mu))^T \\ 0 & I_{p,p} \end{bmatrix} \xi^i, \quad (21)$$

where $\Phi_\ell^i(\mu)$ is the matrix of the first $\ell$ fixed-interface normal modes on component i, $K_{i,i}(\mu)$ and $K_{p,i}(\mu)$ are from (2), and $I_{p,p} \in \mathbb{R}^{N_{FE,p} \times N_{FE,p}}$ is the identity matrix. This transformation corresponds to a reduction in the number of interior DOFs on component i due to the truncation of the fixed-interface normal modes, since we typically choose $\ell \ll N_{FE,i}$. This DOF transformation can either be applied to (17) directly, or first to the modal problem (18) and then to the dynamic system, as in (20).

Many extensions have been proposed to the Craig-Bampton method, and they are generally grouped into the family of Component Mode Synthesis (CMS) methods. CMS involves augmenting the Craig-Bampton representation with extra DOFs on the component interior. CMS methods (including Craig-Bampton) are effective and widely used component-based ROMs since they capture the dominant modal and dynamic behavior of structural systems, while also providing a significant reduction in the number of DOFs via the truncation of the component-interior DOFs. However, let us now consider computational considerations for CMS, and in particular let us revisit the first and second issues above, in the context of CMS methods.

First, regarding the same or additional computational resources required to solve (7) due to the extra density in the matrix structure, we note that the standard formulation of CMS does not involve port reduction, i.e. as shown above the $I_{p,p}$ block in (21) has size $N_{FE,p} \times N_{FE,p}$. However, approaches have been proposed to address this issue with CMS by reduction of the number of port DOFs using truncated eigenmodal representations on ports though the rather slow convergence of eigenmodal expansions is a limitation of this approach and hence the pairwise training, empirical modes, or "optimal modes" approaches can provide an advantage over eigenmodal truncation in this context. However, this issue is not addressed by CMS. It is clear from the dependence on $\mu$ in (17)-(21), that the quantities required to implement the CMS formulation would have to be recalculated each time $\mu$ is changed. Just as in the static, quasi-static, and Helmholtz cases, this is a major limitation of CMS for cases in which we wish to analyze a wide range of model configurations by changing parameters, e.g. in the context of design optimization, or for real-time model updates to match sensor or inspection data in the context of structural digital twins.

To address the issue of computational cost when components change, a component-based parametric ROM eigensolver based on SCRBE has previously been developed. The core idea of this SCRBE-based eigensolver is to reformulate the eigenproblem (18) to include the user-specified parameter vector $\mu$ as well as a shift parameter $\sigma$, such that:

$$(K(\mu)-\sigma M(\mu))V(\mu)=\tau(\sigma,\mu)K(\mu)V(\mu), \quad (22)$$

where $\tau$ is a shifted eigenvalue that satisfies $$\tau(\mu^i(\mu),\mu)=0, \quad (23)$$

where the $\lambda^i(\mu)$ are from (18). The next step is to develop an SCRBE approximation for (22), which proceeds along the same lines as discussed for Helmholtz problems in above, since the left-hand side matrix in (22) is exactly the H matrix from Section 2.2. Note that, as above, we restrict $\sigma$ such that $\sigma \in [0, \lambda_{comp})$ in order to ensure coercivity and hence stability of the component interior solves for H, and once again this is a modest restriction in practice since typically $\lambda L_{comp}$ corresponds to a high frequency at the system level.

Once the SCRBE-based ROM is constructed for (22), we can then use it in the Online stage in order to assemble and solve a reduced eigenproblem for any value of the pair ($\sigma$, $\mu$). In practice, we use this capability as follows: given a user-specified parameter vector $\mu$, find values $\sigma_0^j$ such that $\tau(\sigma_0^j, \mu)=0$ for each j. We apply an iterative root-finding algorithm, such as Brent's method, in order to find the $\sigma_0^j$. These values then yield eigenvalues of the original system due to (23). Based on this framework we are able to efficiently solve parametrized eigenvalue problems via an SCRBE-based ROM for many different values of $\mu$ and, following (20), the resulting eigenmodes can also be applied to dynamic analysis of parametrized systems.

Next we consider application of component-based ROMs to nonlinear structural analysis problems. One specific class nonlinear component-based ROMs is flexible multi-body dynamics. This approach generalizes rigid multi-body dynamics, in which a system consists of multiple connected rigid components, and is widely used in industrial applications, e.g. in modeling of drive-trains, and robotics. In flexible multi-body dynamics, components in a rigid-body system may be replaced by ROMs (typically using CMS) that represent the elastic response of the components. The overall analysis is then geometrically nonlinear due to the finite rotations and translations of each component within the multi-body system, but each flexible component is assumed to have a linear elastic response within its frame of reference. Flexible multi-body dynamics based on CMS is an effective approach within its realm of application, but that realm of application is quite specific and does not address the range of requirements that are needed for structural digital twins, such as detailed stress and fatigue analysis including elastoplasticity, contact/friction, and large strain. As a result, we focus on other approaches herein, but we note that rigid- or flexible-body dynamics approaches are a natural complement to the (linear or nonlinear) SCRBE-based model reduction discussed here because the multi-body dynamics analysis can provide loading data that can be imposed on the SCRBE-based model for detailed structural integrity analysis.

Indeed, in general model reduction of nonlinear systems is a challenging problem. Various so-called hyper-reduction strategies have been developed to enable efficient nonlinear ROMs, such as empirical interpolation (EIM), discrete empirical interpolation (DEIM), or "gappy POD" methods, which enable a full Offline/Online decomposition so that the Online ROM assembly and solve does not depend on $N_{FE}$. Another approach to nonlinear ROMs is machine learning (ML), in which we can non-invasively train ML models based on supervised learning approaches, where a full order solver provides the "truth" data. But each of these methods inherently come with computational complexity or accuracy limitations so that in many cases the computational advantage of a ROM for nonlinear problems may be debatable. This is especially true of "non-smooth" nonlinearities such as contact analysis and elastoplasticity, in which a small change in applied load can lead to a discrete jump in the contact surface or "plastic front." This type of non-smooth response is inherently difficult for ROMs to resolve, since ROMs rely on construction of a low-dimensional representation of the response, and if the response is non-smooth an accurate low-dimensional representation may not exist (in mathematical terms, the Kolmogorov width of the response may be large, so that efficient model reduction is not possible). There are certainly many valid and computationally advantageous methods for nonlinear ROMs which apply in specific cases, but in our view there is no single ROM approach that gives a significant computational advantage over full order models for the full range of nonlinear analysis that is relevant for structural analysis, such as contact/friction, elastoplasticity, and finite strain (e.g. for buckling/post-buckling).

With the above considerations in mind, our approach to obtain a general nonlinear solver that can be used for large-scale structural systems is to apply a so-called Hybrid Solver, which combines SCRBE in linear regions and FE in nonlinear regions within a fully-coupled global solve. We formulate this by first subdividing $\Omega$ into two subregions $\Omega_{lin}$ and $\Omega_{nonlin}$, where $\Omega_{nonlin}$ contains all nonlinearities and $\Omega_{lin}$ does not contain any nonlinearities.

On $\Omega_{lin}$ we apply the SCRBE framework from Section 2.1, which gives the reduced system (12) of size $N_{PR,p}$. On $\Omega_{nonlin}$ we introduce the nonlinear FE operator $G_{FE,nonlin}(\bullet; \mu): \mathbb{R}^{N_{FE,nonlin}} \to \mathbb{R}^{N_{FE,nonlin}}$, where $\mathbb{R}^{N_{FE,nonlin}}$ denotes the number of FE DOFs in $\Omega_{nonlin}$. Let $$U_{hybrid}(\mu) = \begin{bmatrix} \hat{U}(\mu) \\ U_{FE,nonlin}(\mu) \end{bmatrix} \quad (24)$$

denote the global solution to the Hybrid SCRBE/FE system, where $\hat{U} \in \mathbb{R}^{N_{PR,p}}$ is the solution on $\Omega_{lin}$, and $U_{FE,nonlin} \in \mathbb{R}^{N_{FE,nonlin}}$ is the solution on $\Omega_{nonlin}$. In general this defintion of $U_{hybrid}$ permits discontinuity on the interface of $\Omega_{nonlin}$ and $\Omega_{lin}$ so to enforce continuity we introduce a constraint matrix C, which constrains the FE DOFs on the interface to match the SCRBE port modes such that $CU_{hybrid}(\mu)$ is continuous. We may then write the formulation on the entire domain $\Omega$ as:

$$G(U_{hybrid}(\mu); \mu) = C^T \begin{bmatrix} \hat{F}(\mu) - \hat{K}(\mu)\hat{U}(\mu) \\ G_{FE,nonlin}(CU_{hybrid}(\mu)|_{\Omega_{nonlin}}; \mu) \end{bmatrix}, \quad (25)$$

where $G(\bullet; \mu): \mathbb{R}^{N_{R,p}+N_{FE,nonlin}} \to \mathbb{R}^{N_{R,p}+N_{FE,nonlin}}$ denotes the global nonlinear/linear operator on $\Omega$, and the $C^T$ prefactor ensures that we use the same test functions as trial functions in the spirit of a Galerkin formulation.

We treat (25) as a nonlinear system with full two-way coupling between the linear and nonlinear regions, and hence we solve it by applying Newton's method to G. The Jacobian matrix $J_G(\mu) \in \mathbb{R}^{(N_{PR,p}+N_{FE,nonlin}) \times (N_{PR,p}+N_{FE,nonlin})}$ of G is given by:

$$J_G(U_{hybrid}(\mu); \mu) = C^T \begin{bmatrix} -\hat{K}(\mu) & 0 \\ 0 & J_{G_{FE,nonlin}}(U_{hybrid}(\mu)|_{\Omega_{nonlin}}; \mu) \end{bmatrix} C, \quad (26)$$

and then we apply the Newton iteration:

$$J_G(U_{hybrid}^k(\mu); \mu)\Delta U_{hybrid}^k = -G(U_{hybrid}^k(\mu); \mu), \quad (27)$$

$$U_{hybrid}^{k+1}(\mu) = U_{hybrid}^k(\mu) + \Delta U_{hybrid}^k, \quad (28)$$

until we reach convergence.

Using formulation in (25) and (26) in implementation, we may assemble the linear and nonlinear parts of the residual and Jacobian independently based on the SCRBE formulation on $\Omega_{lin}$ and the FE formulation on $\Omega_{nonlin}$, and then the coupling of the two regions is handled entirely by the matrix C.

In the context of structural digital twins, the Hybrid Solver approach has several appealing features. First, it provides the full generality of FE for accurately representing nonlinearities. Second, a digital twin may require multiple separated nonlinear regions, e.g. due to damage or wear or failure in various separated parts of a large system. Due to the nature of the fully-coupled global nonlinear solve, the non-local and cumulative effects of all of these regions are automatically captured by the Hybrid Solver. (In contrast, conventional "submodeling" workflows ignore non-local and cumulative effects.) Third, in the case that we have linear predominance, the Hybrid Solver provides a large computational advantage compared to a full order solve, e.g. a speedup of 100× or more is typical; linear predominance refers to the case where the number of DOFs in the FE region is significantly smaller than the number of full order DOFs in the SCRBE region. We note that linear predominance is common in structural digital twin applications, in which often nonlinearities are only required in regions with localized damage or failure, or localized contact regions, for example. In instances in which we do not have linear predominance, such as large deformation analysis of an aircraft wing or wind turbine blade, and in which the entire model (or almost the entire model) must be treated as nonlinear, a global nonlinear FE solve, or, if applicable, one of the other nonlinear ROM methods cited above may be implemented.

Regarding error indicators and an adaptive ROM enrichment approach, a posteriori error assessment is an important ingredient in the SCRBE framework, for checking the accuracy of SCRBE solutions both during the Offline and Online stages. This provides guidance on when to halt Offline training, or when further ROM enrichment is required during the Online stage. A posteriori error estimators for the SCRBE method (with port reduction) with respect to the "truth" FE formulation on $\Omega$ can be developed. Error estimators for SCRBE have also been developed using a residual-based approach, and, in order to make the approach rigorous, a number of constants are computed in order to bound the error in terms of the residual (e.g. a stability factor for the operator, and constants required to bound the dual norm of the residual, as is generally required for residual-based error estimators). In the methods and systems described below, we compute the residual with respect to the "truth" FE space. However, for the sake of simplicity, we omit calculation of the extra constants required for detailed error estimators, and instead use the residual directly as an a posteriori error indicator. This residual-based error indicator approach fits well in the context of structural digital twins, since the residual can be interpreted as a "force balance" criterion, which for structural engineers is a physically relevant quantity for indicating solution accuracy. Moreover, we compute the residual with respect to the discrete full order system and this quantity is typically used to determine a stopping criterion in the context of iterative solvers (either linear Krylov subspace-type methods or nonlinear Newton-type methods), hence the idea of assessing SCRBE solution accuracy based this quantity is natural to engineers who are familiar with iterative solvers.

To make our formulation of the residual precise, we first must introduce $\hat{U}(\mu)$, which is the SCRBE solution that is reconstructed on the entire system-level domain $\Omega$ based on a weighted sum of port DOFs and component interior DOFs scaled by coefficients from $\ddot{U}_p(\mu)$. Then we define the residual $\mathcal{R}(\mu)$ based on (1) as follows:

$$\mathcal{R}(\mu)=F(\mu)-K(\mu)\hat{U}(\mu). \tag{29}$$

$\mathcal{R}(\mu)$ can be evaluated in a computationally efficient manner by treating the contribution to the residual from component interiors and ports separately. Then finally we introduce our error indicator $\varepsilon(\mu)=\|\mathcal{R}(\mu)\|/\|F(\mu)\|$, which is the norm of the residual normalized by the norm of the load.

We use the residual-based error indicator in both the Offline stage and the Online stage, as described below. Note that in the description below we use the notion of a model, which refers to an assembly of SCRBE components in which all parameters (materials, geometry, loads, etc.) are specified.

As has been noted, the use of the SCRBE framework in the methods and systems described herein provides a powerful approach for enabling structural digital twins of large-scale systems. These capabilities are further realized by connecting SCRBE-based models to inspection and sensor data and configuring post-processing for the purposes of automated asset integrity reporting. The data flow from operational asset data (e.g., sensors or inspections), to structural digital twin update and analysis, to post-processing and reporting may be referred to as a "digital thread". This digital thread may provide asset operators with deep structural integrity insights that leverage the asset data and the SCRBE-based digital twin.

Figure 2A:
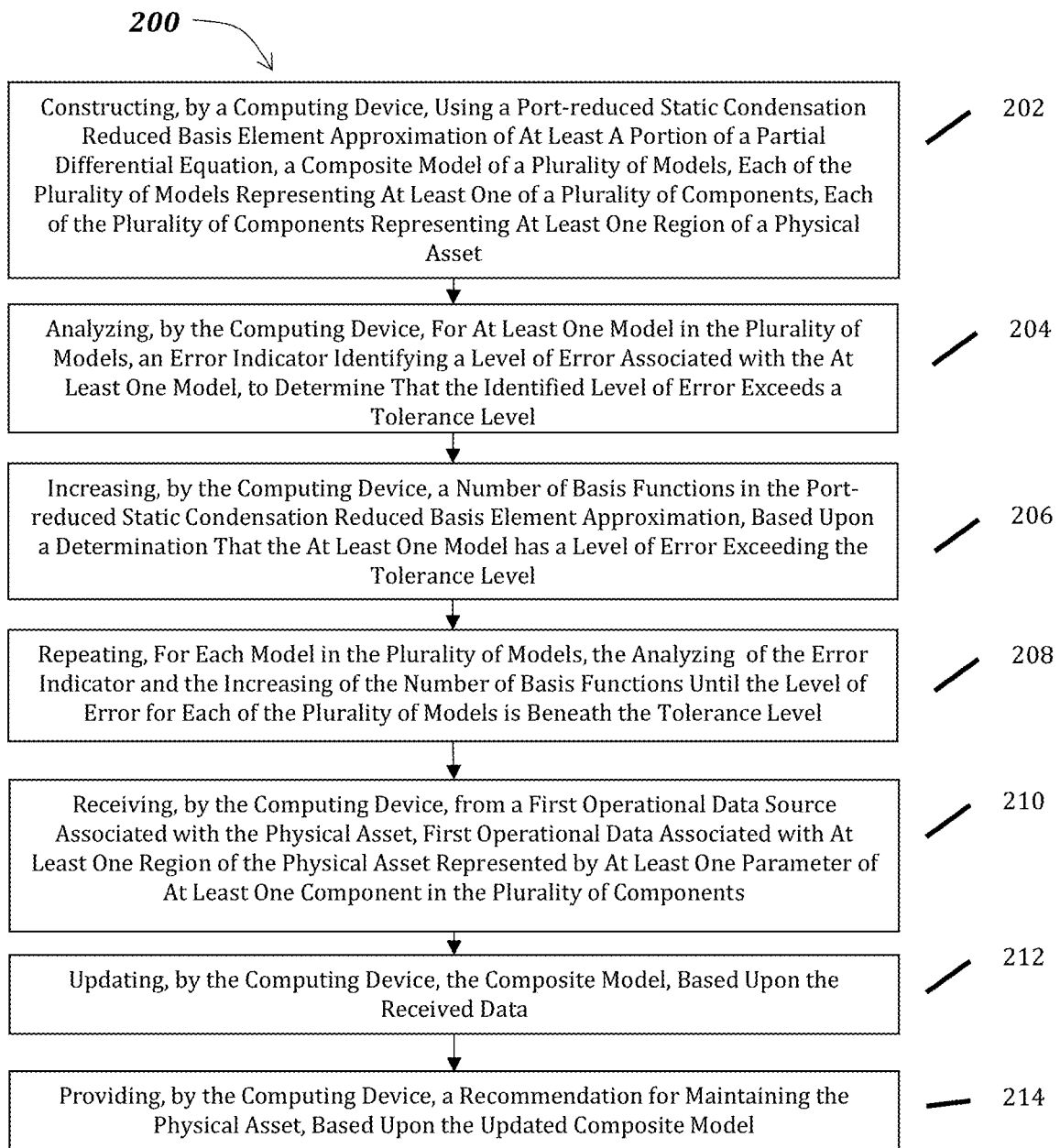
FIG. 2A is a block diagram depicting an embodiment of a system for maintaining a physical asset based on recommendations generated by analyzing a model of the physical asset, the model comprising a plurality of components and forming a physics-based digital twin of the physical asset.
Figure 3:
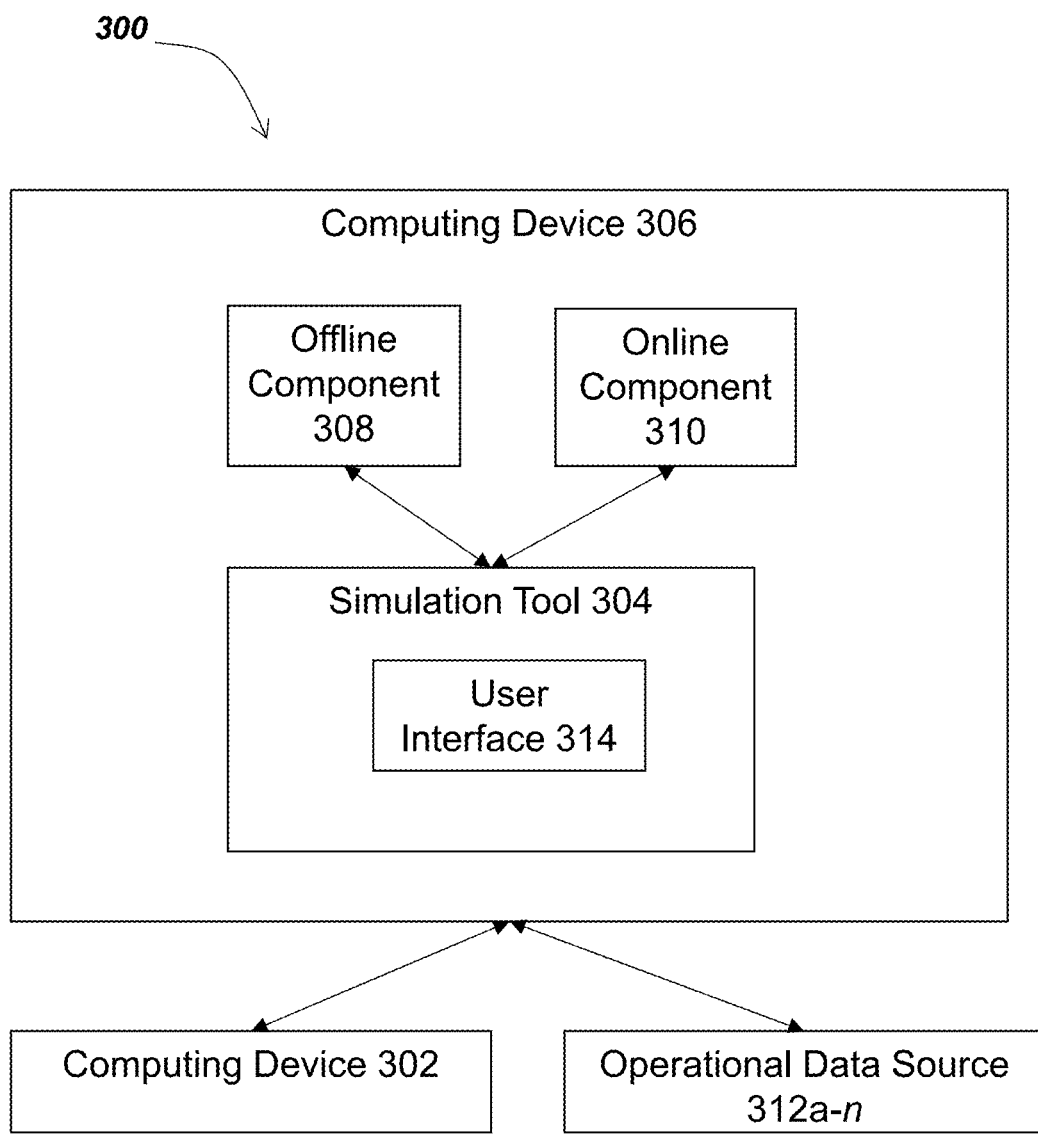
FIG. 3 is a flow diagram depicting one embodiment of a method for maintaining a physical asset based on recommendations generated by analyzing a model of the physical asset, the model comprising a plurality of components and forming a physics-based digital twin of the physical asset.

Referring now to FIG. 2A, in conjunction with FIG. 3, a method 200 for maintaining a physical asset based on recommendations generated by analyzing a model of the physical asset, the model comprising a plurality of components and forming a physics-based digital twin of the physical asset, includes constructing, by a computing device, using a port-reduced static condensation reduced basis element approximation of at least a portion of a partial differential equation, a composite model of a plurality of models, each of the plurality of models representing at least one of a plurality of components, each of the plurality of components representing at least one region of a physical asset (202). The method 200 includes analyzing, by the computing device, for at least one model in the plurality of models, an error indicator identifying a level of error associated with the at least one model, to determine that the identified level of error exceeds a tolerance level (204). The method 200 includes increasing, by the computing device, a number of basis functions in the port-reduced static condensation reduced basis element approximation, based upon a determination that the at least one model has a level of error exceeding the tolerance level (206). The method 200 includes repeating, for each model in the plurality of models, the analyzing of the error indicator and the increasing of the number of basis functions until the level of error for each of the plurality of models is beneath the tolerance level (208). The method 200 includes receiving, by the computing device, from a first operational data source associated with the physical asset, first operational data associated with at least one region of the physical asset represented by at least one parameter of at least one component in the plurality of components (210). The method 200 includes updating, by the computing device, the composite model, based upon the received first operational data (212). The method 200 includes providing, by the computing device, a recommendation for maintaining the physical asset, based upon the updated composite model (214).

The method 200, therefore, provides an Offline stage that executes a number of steps. Method 200 includes specifying a set of training models, $\mathcal{M}$, a training tolerance, TOL, and a number of training iterations, $N_\mathcal{M}$. Method 200 includes, for each model $M \in \mathcal{M}$, performing the following steps: (a) Solve with the current SCRBE ROM and calculate the error indicator $\varepsilon(\mu)$; and (b) If $\varepsilon(\mu) > \text{TOL}$, perform component and port enrichment of the SCRBE ROM, as described above. Method 200 includes repeating steps (a) and (b) $N_\mathcal{M}$ times, or until $\varepsilon \leq \text{TOL}$ for all $M \in \mathcal{M}$. The method 200 also includes an Online stage. In the Online stage, for any model M, the method 200 solves the system using the SCRBE ROM that was generated in the Offline stage. We may optionally also evaluate $\varepsilon(\mu)$ to validate the accuracy of the SCRBE solution, and if we find that $E(\mu)$ is larger than desired, we can run further enrichment by revisiting the procedure from the Offline stage when needed—this can be performed in a fully automated manner (driven by the error indicator), or the user may choose to guide if and/or when further enrichment is to be performed. Thus, the availability of the error indicator provides a robust method for ensuring accuracy of our solutions in the Online stage. Also, if a thorough Offline stage is performed, then typically we rarely need to revisit Offline calculations, and in most cases we will have a purely Online ROM that provides fast and accurate solutions for the full range of systems of interest. We refer to the Offline/Online procedure describe above as Adaptive ROM Enrichment (ARE).

Referring now to FIG. 2A, in greater detail and still in conjunction with FIG. 3, a method 200 for maintaining a physical asset based on recommendations generated by analyzing a model of the physical asset, the model comprising a plurality of components and forming a physics-based digital twin of the physical asset, includes constructing, by a computing device, using a port-reduced static condensation reduced basis element approximation of at least a portion of a partial differential equation, a composite model of a plurality of models, each of the plurality of models representing at least one of a plurality of components, each of the plurality of components representing at least one region of a physical asset (202). The computing device 306 may execute an offline component 308 (which may be provided as either a hardware or a software component) that uses the SCRBE framework to construct the composite model of the plurality of models, $\mathcal{M}$. As indicated above, in some embodiments, a hybrid solver is used to construct the composite model; in such embodiments, at least a first portion of the partial differential equation is approximated using the SCRBE approach while FEA is applied to at least a second portion of the partial differential equation.

The method 200 includes analyzing, by the computing device, for at least one model in the plurality of models, an error indicator identifying a level of error associated with the at least one model, to determine that the identified level of error exceeds a tolerance level (204). The offline component 308 may solve with the current SCRBE ROM and calculate the error indicator.

The method 200 includes increasing, by the computing device, a number of basis functions in the port-reduced static condensation reduced basis element approximation, based upon a determination that the at least one model has a level of error exceeding the tolerance level (206). If the error indicator is greater than the tolerance level, then the offline component 308 enriches the SCRBE ROM (e.g., adds back in at least one basis function), as described above. Basis functions (or degrees of freedom, as they are also described herein) may be added on both interfaces and interior of components. Component interior basis functions may be added following the reduced basis greedy algorithm, as described above, in which residual-based a posteriori error bounds in order to guide adaptive sampling in parameter space in order generate efficient RB models that are accurate over the entire parameter domain of interest. Component interface basis functions may be added based on adding data that captures the dominant information transfer between adjacent components The method 200 includes repeating, for each model in the plurality of models, the analyzing of the error indicator and the increasing of the number of basis functions until the level of error for each of the plurality of models is beneath the tolerance level (208). In one embodiment, the method 200 includes repeating, for each model in the plurality of models, the analyzing of the error indicator and the increasing of the number of basis functions until the level of error for each of the plurality of models is beneath the tolerance level or until a threshold number of iterations is reached. As an example, the method 200 may terminate (208) after determining that the tolerance level is met by each model in the plurality of models. As another example, the method 200 may terminate (208) after a predefined number of iterations; in this way, if each of the plurality of models cannot meet the tolerance level, the method 200 does not continue iterating endlessly.

In connection with the method 200, (202) (208) may be referred to as the offline stage. In connection with the method 200, (202)-(208) may be performed before the generation of a visual rendering of the composite model. In connection with the method 200, (202)-(208) may be performed before the receiving, by the computing device, from the first operational data source associated with the physical asset, first operational data associated with at least one region of the physical asset represented by at least one parameter of at least one component in the plurality of components.

In some embodiments, before generating an optional visual rendering of the composite model or receiving operational data, the method 200 includes receiving user input (e.g., for modeling a "what if" scenario). Therefore, the method 200 may include receiving, by the computing device, first user input identifying an input value indicative of at least one physical condition under which the physical asset is to be evaluated and using, by the computing device, the composite model to generate at least one output value based at least in part on the at least one input value, wherein the at least one output value is indicative of a behavior of the physical system under the at least one physical condition, wherein the at least one output value comprises a plurality of output values over an N-dimensional domain. The N-dimensional domain may be a 3-dimensional domain or any other value of N. The user input may be any of a variety of input types. For example, the user input may identify an input value extracted from an inspection report based on a physical inspection of the physical asset. As another example, the user input may identify an input value extracted from operational data received from a sensor associated with the physical asset. As a further example, the user input may identify an input value for modeling a component under a particular operational condition, such as to perform fatigue life estimation of critical parts or to perform a strength check based on an industry standard under at least one operational condition.

In some embodiments, the method 200 may include generating, by a simulation tool executed by the computing device, a visual rendering of the composite model including a visualization of at least one result of a physics-based analysis of the physical asset. In some embodiments, the simulation tool 304 generates the visual rendering of the composite model. The simulation tool 304 may generate a visual rendering of the entire composite model, including visualizations of all results of the physics-based analysis of the physical asset. Alternatively, the simulation tool 304 may visualization a subset of the resulting values; for example, the simulation tool 304 may visualization a level of stress at a single weld point as opposed to a level of stress throughout the physical asset. The simulation tool 304 (which may be provided as a hardware component or as a software component) may generate the visual rendering. The simulation tool 304 may include a user interface with which a user of the system 300 may interact with the visual rendering of the composite model and provide user input. For instance, the user interface 314 may allow the user to construct a model for a physical system by specifying one or more aspects of the physical system, such as geometry, material, and/or any other suitable physical characteristics. Once such a model is constructed, the user may, again via the user interface 314, direct the simulation tool 304 to perform a simulation based on the model to predict how the physical system may behave under one or more selected conditions. Results of the simulation may be delivered to the user via the user interface 314 in any suitable manner, such as by visually rendering one or more output values of the simulation. Therefore, an improved simulation tool is provided that allows a user to modify one or more aspects of a physical system and obtain updated simulation results in real time. For instance, user interface functions may be provided for the user to perform various modifications, including, but not limited to, modifying one or more parameters of a component, adding a component (e.g., by cloning an existing component), removing a component, disconnecting previously connected components, moving a component from one part of the physical system to another part of the physical system, and rotating a component. In response to such changes requested by the user, the simulation tool may be able to quickly deliver updated simulation results by leveraging previously computed data. For example, in some implementations, the simulation tool may update certain computations relating to components whose parameters and/or connections are changed but may reuse previously computed data for components that are not directly affected by the changes. In accordance with further embodiments, an improved simulation tool may perform one or more consistency checks to determine whether changes requested by a user are compatible with other aspects of a physical system. The simulation tool may alert the user if any incompatibility is detected. Additionally, or alternatively, the simulation tool may propose further changes to the physical system to remove one or more incompatibilities introduced by the user-requested changes. In accordance with further embodiments, an improved simulation tool is provided that automatically computes an error associated with a simulation result. In some implementations, an error may be a rigorously computed error bound, such as a maximum possible difference between the simulation result and a result that would have been obtained had a full FEA solution been computed. For example, in an embodiment in which RB approximations are computed for component interior functions, a "local" error bound may be computed for each bubble function, where the local error bound indicates a difference between a reduced order model computed for the bubble function and a corresponding full FEA solution. Such local error bounds may then be combined to obtain an overall error bound for an entire physical system or a portion thereof. In other implementations, an error may be an error estimate that can be computed in less time compared to a rigorous error bound. In yet some other implementations, a user may choose which type of error (e.g., rigorous error bound or error estimate) is to be computed by the simulation tool.

The method 200 includes receiving, by the computing device, from a first operational data source associated with the physical asset, first operational data associated with at least one region of the physical asset represented by at least one parameter of at least one component in the plurality of components (210). The online component 310 executing on the computing device 306 may receive the first operational data. The computing device 306 may receive from the first operational data source associated with the physical asset, first operational data generated by a sensor associated with the physical asset. The computing device 306 may receive from the first operational data source associated with the physical asset, first operational data extracted from an inspection report associated with the physical asset; for example, the inspection data may include a result from a visual inspection of an asset (e.g., an observation that there is a crack or corrosion on a pipe and that information should be built into the digital twin). The computing device 306 may receive from the first operational data source associated with the physical asset, first operational data extracted from a report generated by an operator of the physical asset. The operational data inputs to a digital thread may include the inspection and sensor data available from operational assets. Examples include, without limitation, thickness measurements based on ultrasound thickness gauging; environmental monitoring at specific intervals in time, e.g. wind and wave states for an offshore structure; operational load monitoring, e.g. throughput rates, tank fill levels, and number of loading/unloading cycles per time interval; measurements from structural sensors such as accelerometers and strain gauges; pressure and/or temperature monitoring.

The method 200 includes updating, by the computing device, the composite model, based upon the received first operational data (212). The computing device may identify, within the received first operational data, an input value indicative of at least one physical condition under which the physical asset is to be evaluated and use the composite model to generate at least one output value based at least in part on the at least one input value, wherein the at least one output value is indicative of a behavior of the physical system under the at least one physical condition, wherein the at least one output value comprises a plurality of output values over an N-dimensional domain. The computing device may execute an importer application that receives measurement data, formats the data, and updates the model to incorporate measurement data; for example, for thickness measurements, the computing device may receive measurement data in a document including the measurement data in a comma-separated values format (e.g., in a spreadsheet) and may update the SCRBE model's thickness to match the imported measurements. For sensor data, the computing device may receive the data in an agreed-upon format and incorporate the received data into the SCRBE model. Sensor readings may be received in a text format and then importer software may be configured to read the agreed-upon text format and apply the data to the model. The computing device may receive an identification of where sensors are installed on a physical asset. The computing device may receive an identification of a format for inspection data specifying where in the physical asset each measurement is coming from. The formatting may be agreed upon between the operator or owner of the physical asset and the user generating the digital twin when the digital twin is being initially configured so that the digital twin will be configured in a manner consistent with the operational data that will be received. Once the computing device receives the operational data from the operational data source, whether an operator observation or a sensor reading or an inspection report, the computing device may use the received operational data as an input to the SCRBE model.

In some embodiments, the simulation tool 304 has generated a visual rendering of the composite model. In such embodiments, the simulation tool 304 may update the visual rendering of the composite model based on updated output values generated by the composite model using the received first operational data.

The method 200 may include updating the composite model not just once upon receipt of first operational data from a first operational data source but many times upon receipt of a plurality of pieces of operational data from a plurality of operational data sources. For example, the digital twin may be constantly updated throughout the online stage in order to keep "in sync" with the physical asset. The method 200 may execute steps for updating the model and any optionally generated visual rendering based upon receiving different data from the same operational data source or based upon receiving different data from a different operational data source, or both. Therefore, the method 200 may include receiving, by the computing device, from the first operational data source associated with the physical asset, second operational data associated with the at least one region of the physical asset represented by the at least one parameter of the at least one component in the plurality of components; updating, by the computing device, the composite model, based upon the received second operational data; and providing, by the computing device, a second recommendation for maintaining the physical asset, based upon the updated composite model. In embodiments in which the simulation tool 304 has generated a visual rendering of the composite model, the simulation tool 304 may update the visual rendering of the composite model based on updated output values generated by the composite model using the received second operational data. Similarly, the method 200 may include receiving, by the computing device, from a second operational data source associated with the physical asset, second operational data associated with at least a second region of the physical asset represented by at least a second parameter of at least a second component in the plurality of components; updating, by the computing device, the composite model, based upon the received second operational data; and providing, by the computing device, a second recommendation for maintaining the physical asset, based upon the updated composite model. In embodiments in which the simulation tool 304 has generated a visual rendering of the composite model, the simulation tool 304 may update the visual rendering of the composite model based on updated output values generated by the composite model using the received second operational data.

As indicated above, the method 200 may include updating the Offline stage periodically. Updating may include changing values within at least one model in the plurality of models. Updating may include replacing at least one model in the plurality of models to reflect new operating conditions that have been observed (e.g., by operators generating inspection reports or by sensors generating sensor data). Therefore, the method 200 may include receiving second operational data from the first operational data source; updating at least one model in the plurality of models based upon the received second operational data; analyzing, by the computing device, for at least one model in the plurality of models, an error indicator identifying a level of error associated with the at least one model, to determine whether the identified level of error exceeds a tolerance level; increasing, by the computing device, a number of basis functions in the port-reduced static condensation reduced basis element approximation, based upon a determination that the at least one model has a level of error exceeding the tolerance level; repeating the analyzing of the error indicator and the increasing of the number of basis functions for each model in the plurality of models until the level of error each of the plurality of models is beneath the tolerance level; updating, by the computing device, the composite model, based upon the received data; and providing, by the computing device, a recommendation for maintaining the physical asset, based upon the updated composite model. In embodiments in which the simulation tool 304 has generated a visual rendering of the composite model, the simulation tool 304 may update the visual rendering of the composite model based on updated output values generated by the composite model using the received second operational data. Similarly, the method 200 may include receiving second operational data from a second operational data source; updating at least one model in the plurality of models based upon the received second operational; analyzing, by the computing device, for at least one model in the plurality of models, an error indicator identifying a level of error associated with the at least one model, to determine whether the identified level of error exceeds a tolerance level; increasing, by the computing device, a number of basis functions in the port-reduced static condensation reduced basis element approximation, based upon a determination that the at least one model has a level of error exceeding the tolerance level; repeating, for each model in the plurality of models, the analyzing of the error indicator and the increasing of the number of basis functions until the level of error each of the plurality of models is beneath the tolerance level; updating, by the computing device, the composite model, based upon the received data; and providing, by the computing device, a recommendation for maintaining the physical asset, based upon the updated composite model. In embodiments in which the simulation tool 304 has generated a visual rendering of the composite model, the simulation tool 304 may update the visual rendering of the composite model based on updated output values generated by the composite model using the received second operational data.

The method 200 includes providing, by the computing device, a recommendation for maintaining the physical asset, based upon the updated composite model (214). The system 100 may generate the recommendation based on at least one output value computed by the updated composite model. Typical outputs of the digital thread are industry-specific code checks for structural integrity, such as strength, fatigue, and fitness-for-service standards from recognized standards bodies. The calculations required by these standards typically involve post-processing stress data (often based on hundreds or thousands of distinct load cases) in order to calculate quantities such as remaining fatigue estimates or buckling utilization.

The online component 310 may generate the recommendation for maintaining the physical asset. The online component 310 may provide the recommendation to the simulation tool 304 for display to the user via the user interface 314. In addition to, or instead of, providing recommendations for maintaining the physical asset, the computing device 306 may provide a recommendation for identifying a plurality of aspects of the physical asset to inspect the plurality of aspects ranked according to a level of priority, based upon the updated composite model. In addition to, or instead of, providing recommendations for maintaining the physical asset, the computing device 306 may provide a recommendation for determining a level of feasibility of a proposed modification to the physical asset, based upon the updated composite model. In addition to, or instead of, providing recommendations for maintaining the physical asset, the computing device 306 may provide a recommendation for determining at least one operating condition of the physical asset, based upon the updated composite model.

The user interface 314 may include a dashboard interface in which users can click a button that will run the relevant standards-based checks based on the current state of the digital twin (i.e. incorporating the up-to-date operational data) and generate a report based on the check. The report may include one or more recommendations, such as "everything is OK", or "There is an issue with XYZ region of the asset", or "It is not OK to operate the asset in Scenario XYZ". This output can be presented also as a "traffic light" for each asset, e.g. "green light" means all checks passed, "red light" means at least one check failed and indicates that there is something that needs further attention or investigation from the operator, who can then check the full report for details. In some embodiments, the system 100 includes functionality for transmitting a report including the generated recommendations to another computing device. In some embodiments, the system 100 includes functionality for implementing a recommendation.

Figure 2B:
Referring now to FIG. 2B, a block diagram depicts a visualization of the method 200 resulting in a digital thread for a floating offshore structure.

Referring now to FIG. 2B, a block diagram depicts a visualization of the method 200 resulting in a digital thread for a floating offshore structure. Inputs are sensor data and inspection data, which are used to automatically update and analyze the structural digital twin. Analysis typically consists of thousands of SCRBE solves in order to assess strength and fatigue of the asset in its "as is" state. Once the analysis is complete, reporting based on classification society standards is automatically generated.

Figure 2C:
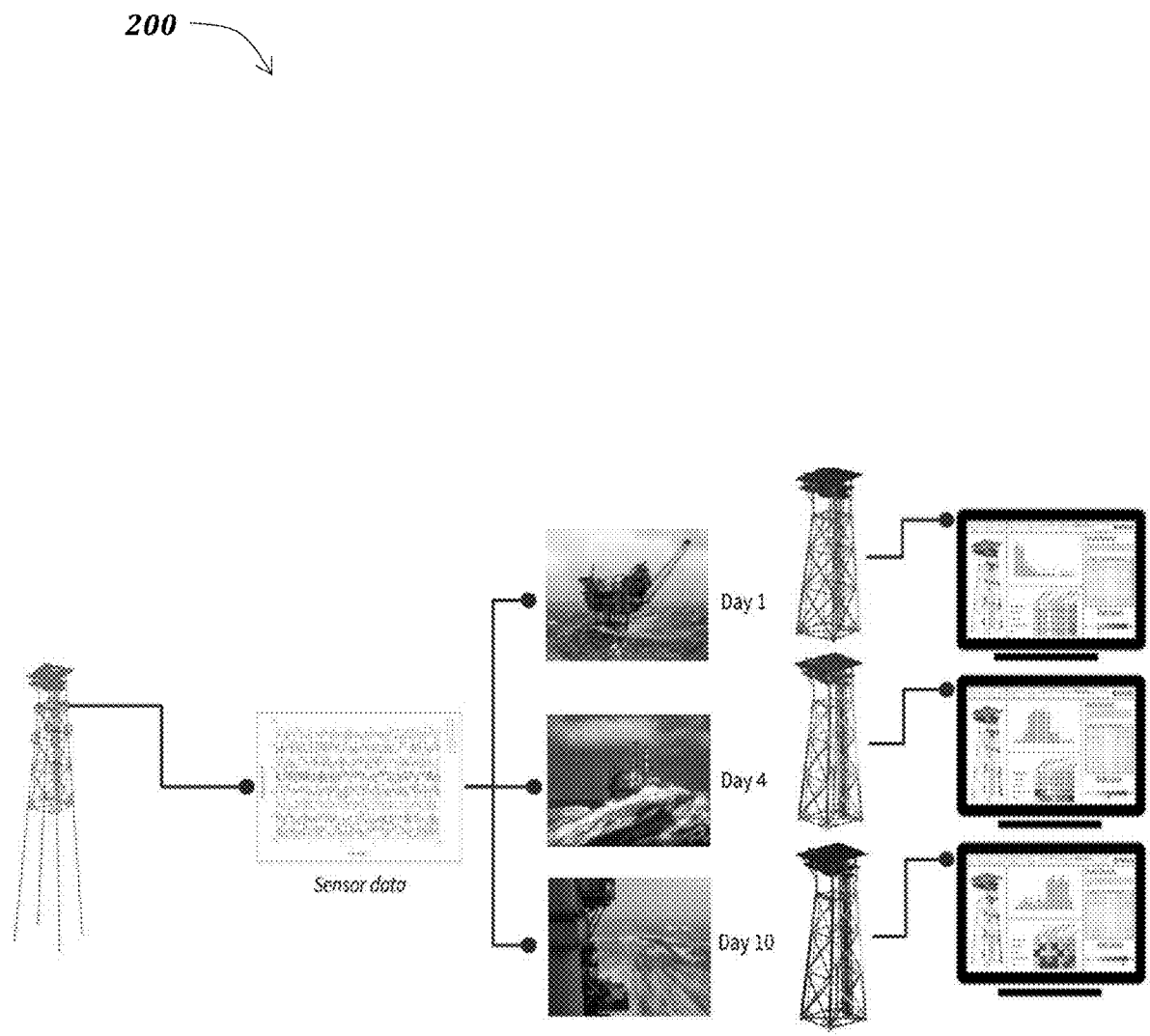
Referring now to FIG. 2C, a block diagram depicts a visualization of the method 200 resulting in a digital thread for an offshore platform.

Referring now to FIG. 2C, a block diagram depicts a visualization of the method 200 resulting in a digital thread for an offshore platform. As shown in FIG. 2C, a plurality of accelerometers on a structure (e.g., the physical asset) monitor the structural response to its environment. The method 200 executes and generates automated reporting based on industry standards.

As has been shown, the SCRBE framework described above provides for the four properties for digital twin modeling that were described above. Regarding holistic and detailed modeling, the SCRBE framework resolves issues of costly computing, which, enables systems equivalent to $0(10^7)$ or $0(10^8)$ FE DOFs to be solved efficiently. This enables holistic and detailed modeling of large-scale structural systems. Regarding speed, the SCRBE framework satisfies the requirement as a consequence of both the component-local RB models and the port reduction; component-local RB enables fast modifications to a model, and port reduction enables fast system-level solves. Regarding parametric modeling, the component-local RB models introduce parametric ROM capabilities in a convenient and efficient manner, and this scales well to large numbers of parameters since each per-component RB greedy is typically only required to deal with a few parameters. Regarding standards compliance and certifiable accuracy, SCRBE is fundamentally a physics-based method, which is formulated in terms of the same mesh-based approach as FE, except with acceleration due to projection onto a reduced set of port DOFs and component-interior RB DOFs; this means that all of the standards for structural integrity analysis that were typically designed for FE apply directly to SCRBE models. Moreover, as described above, we can evaluate error estimators or indicators for the SCRBE approach, which ensures the accuracy of any solution that we compute in the Online stage. Hence, the SCRBE-based approach provides all of the key capabilities of digital twins in order to enable the structural digital twin workflows that are of interest for large-scale industrial systems.

The methods and systems described herein provide functionality for implementing a SCRBE framework that provides powerful and unique capabilities for structural digital twins of large-scale assets. An Adaptive ROM Enrichment methodology enables efficient and reliable training of SCRBE models in the Offline stage, as well as accuracy assessment and enrichment guidance (when needed) in the Online stage. A range of structural analysis examples demonstrate the scalability, speed, and parametrization capabilities that are enabled by the SCRBE framework and the core concepts of a digital thread built around SCRBE-based structural digital twins were described above. The digital thread described herein enables an automated framework that provides operators with deeper structural integrity insights based on the "as is" state of critical assets, and hence empowers safer and more efficient operations.

Figure 1B:
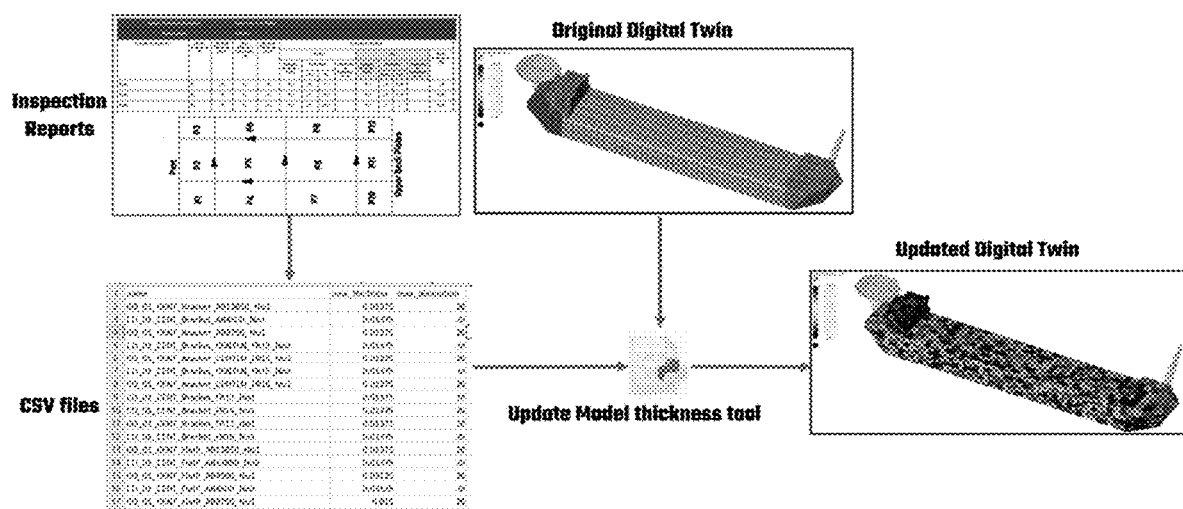
FIG. 1B depicts a hull model, updated based upon at least one value within an inspection report.
Figure 1C:
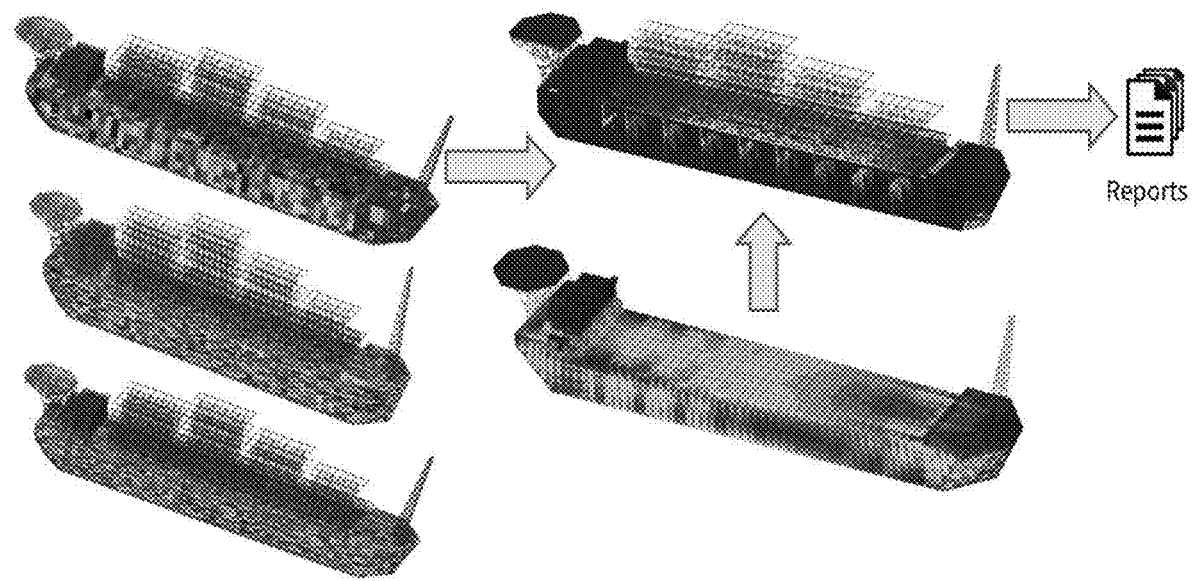
FIG. 1C depicts updated hull models used to generate automated buckling check reports.

FIGS. 1B and 1C provide non-limiting examples of the methods and systems described above. Referring now to FIG. 1B, a block diagram depicts a hull model, updated based upon at least one value within an inspection report. The inspection report specifies a thickness for each entity (e.g., plate or stiffener) in the hull, so that a script can automatically update the thicknesses in the corresponding entities in the structural digital twin in order to incorporate the inspection data. Referring now to FIG. 1C, a block diagram depicts updated hull models used to generate automated buckling check reports. The figures on the left show each entity in the hull (e.g., plates and stiffened panels). Stress data, shown in the middle-bottom figure, is extracted for each entity and the buckling standards then specify a formula to evaluate for each entity to provide a utilization value. In the middle-top figure we show the utilization values as a "heat map" on the hull and any entity with utilization exceeding 1 would be considered a failure. The system then generates a report (right) that identifies any entities that failed a buckling check. Such reports can be used by operators of the physical asset for prioritizing inspection, maintenance, and repair, or assessing structural health of the asset.

Figure 4A:
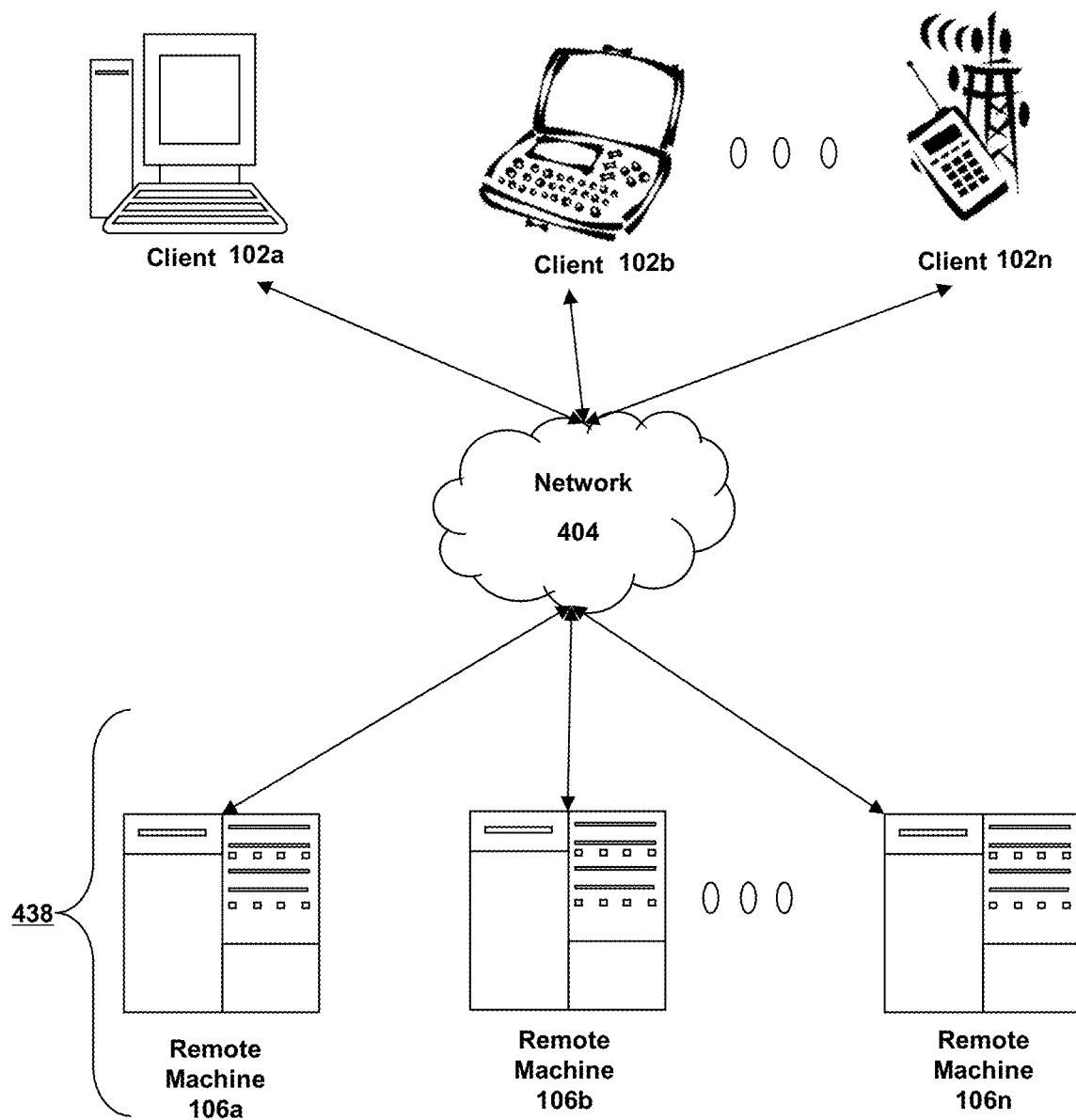
FIGS. 4A-4C are block diagrams depicting embodiments of computers useful in connection with the methods and systems described herein.
Figure 4B:
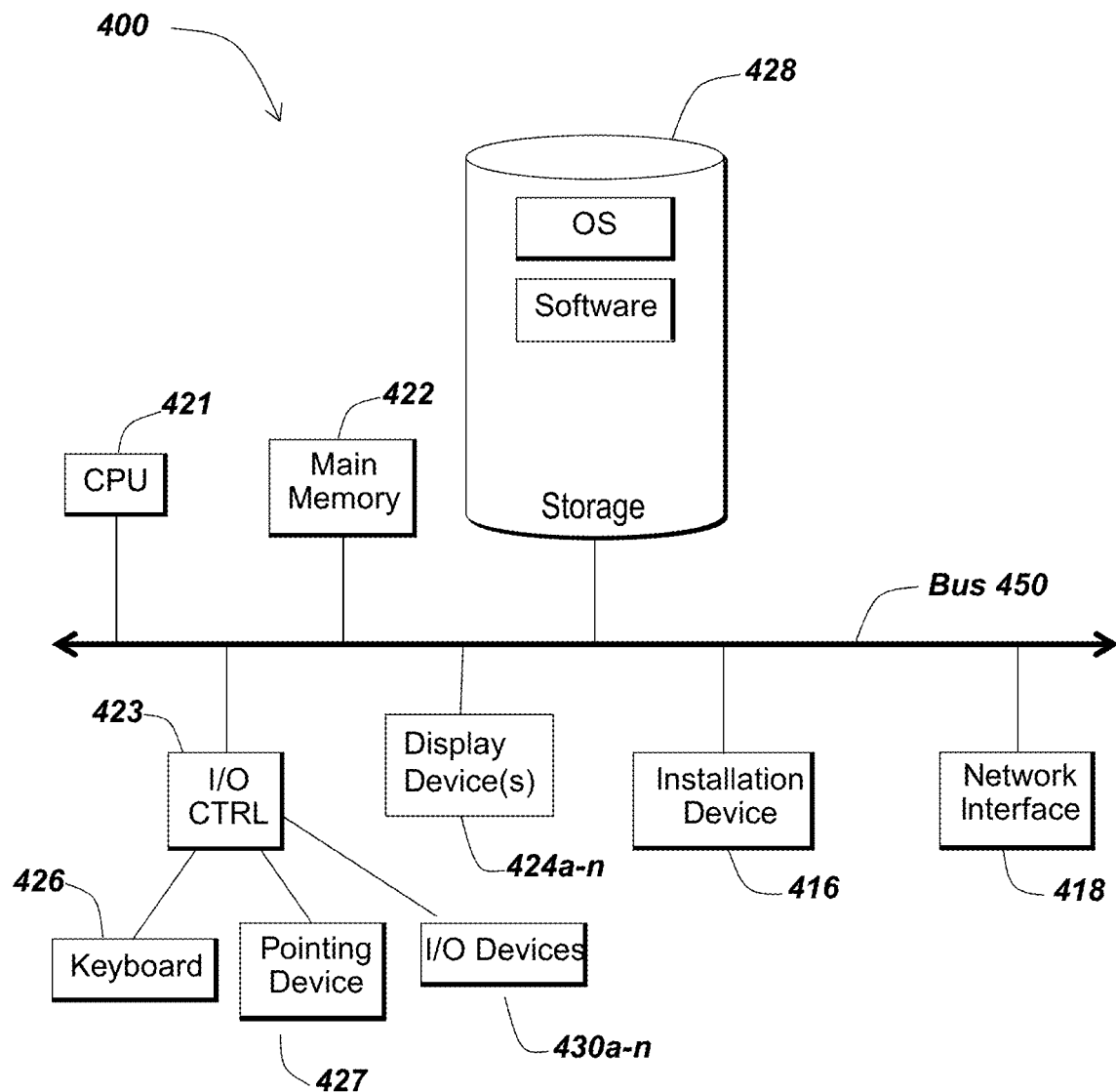
Figure 4C:
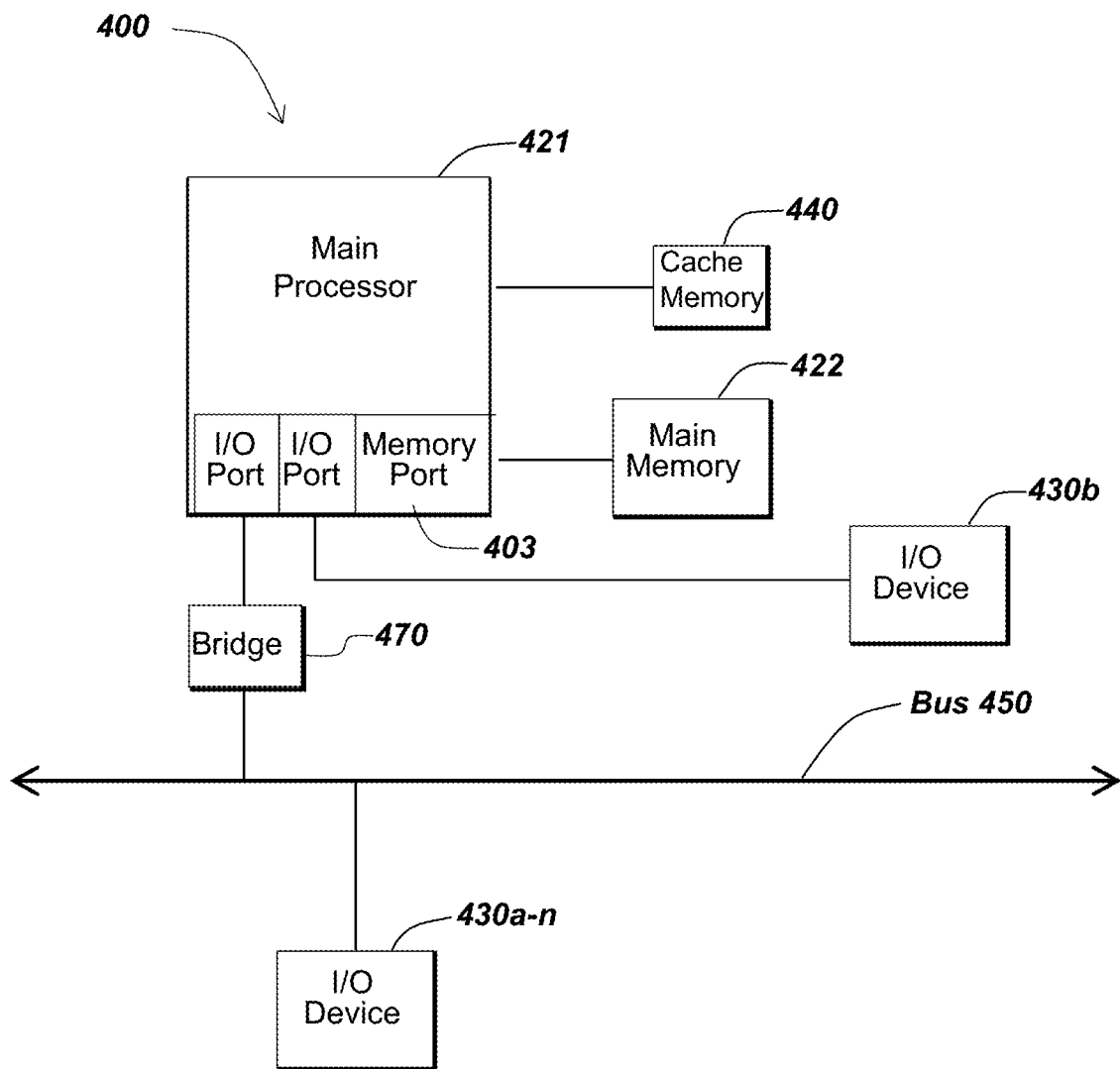

Referring now to FIGS. 4A, 4B, and 4C, block diagrams depict additional detail regarding computing devices that may be modified to execution functionality for implementing the methods and systems described above. Referring now to FIG. 4A, an embodiment of a network environment is depicted. In brief overview, the network environment comprises one or more clients 102a-102n (also generally referred to as local machine(s) 102, client(s) 102, client node(s) 102, client machine(s) 102, client computer(s) 102, client device(s) 102, computing device(s) 102, endpoint(s) 102, or endpoint node(s) 102) in communication with one or more remote machines 106a-106n (also generally referred to as server(s) 106 or computing device(s) 106) via one or more networks 404.

Although FIG. 4A shows a network 404 between the client(s) 102 and the remote machines 106, the client(s) 102 and the remote machines 106 may be on the same network 404. The network 404 can be a local area network (LAN), such as a company Intranet, a metropolitan area network (MAN), or a wide area network (WAN), such as the Internet or the World Wide Web. In some embodiments, there are multiple networks 404 between the client(s) and the remote machines 106. In one of these embodiments, a network 404' (not shown) may be a private network and a network 404 may be a public network. In another of these embodiments, a network 404 may be a private network and a network 404' a public network. In still another embodiment, networks 404 and 404' may both be private networks. In yet another embodiment, networks 404 and 404' may both be public networks.

The network 404 may be any type and/or form of network and may include any of the following: a point to point network, a broadcast network, a wide area network, a local area network, a telecommunications network, a data communication network, a computer network, an ATM (Asynchronous Transfer Mode) network, a SONET (Synchronous Optical Network) network, an SDH (Synchronous Digital Hierarchy) network, a wireless network, and a wireline network. In some embodiments, the network 404 may comprise a wireless link, such as an infrared channel or satellite band. The topology of the network 404 may be a bus, star, or ring network topology. The network 404 may be of any such network topology as known to those ordinarily skilled in the art capable of supporting the operations described herein. The network 404 may comprise mobile telephone networks utilizing any protocol or protocols used to communicate among mobile devices (including tables and handheld devices generally), including AMPS, TDMA, CDMA, GSM, GPRS, UMTS, or LTE. In some embodiments, different types of data may be transmitted via different protocols. In other embodiments, the same types of data may be transmitted via different protocols.

A client(s) 102 and a remote machine 106 (referred to generally as computing devices 100) can be any workstation, desktop computer, laptop or notebook computer, server, portable computer, mobile telephone, mobile smartphone, or other portable telecommunication device, media playing device, a gaming system, mobile computing device, or any other type and/or form of computing, telecommunications or media device that is capable of communicating on any type and form of network and that has sufficient processor power and memory capacity to perform the operations described herein. A client(s) 102 may execute, operate or otherwise provide an application, which can be any type and/or form of software, program, or executable instructions, including, without limitation, any type and/or form of web browser, web-based client, client-server application, an ActiveX control, or a JAVA applet, or any other type and/or form of executable instructions capable of executing on client(s) 102.

In one embodiment, a computing device 106 provides functionality of a web server. In some embodiments, a web server 106 comprises an open-source web server, such as the NGINX web servers provided by NGINX, Inc., of San Francisco, Calif., or the APACHE servers maintained by the Apache Software Foundation of Delaware. In other embodiments, the web server executes proprietary software, such as the INTERNET INFORMATION SERVICES products provided by Microsoft Corporation of Redmond, Wash., the ORACLE IPLANET web server products provided by Oracle Corporation of Redwood Shores, Calif., or the BEA WEBLOGIC products provided by BEA Systems of Santa Clara, Calif.

In some embodiments, the system may include multiple, logically-grouped remote machines 106. In one of these embodiments, the logical group of remote machines may be referred to as a server farm 438. In another of these embodiments, the server farm 438 may be administered as a single entity.

FIGS. 4B and 4C depict block diagrams of a computing device 100 useful for practicing an embodiment of the client(s) 102 or a remote machine 106. As shown in FIGS. 4B and 4C, each computing device 100 includes a central processing unit 421, and a main memory unit 422. As shown in FIG. 4B, a computing device 100 may include a storage device 428, an installation device 416, a network interface 418, an I/O controller 423, display devices 424a-n, a keyboard 426, a pointing device 427, such as a mouse, and one or more other I/O devices 430a-n. The storage device 428 may include, without limitation, an operating system and software. As shown in FIG. 4C, each computing device 100 may also include additional optional elements, such as a memory port 403, a bridge 470, one or more input/output devices 430a-n (generally referred to using reference numeral 430), and a cache memory 440 in communication with the central processing unit 421.

The central processing unit 421 is any logic circuitry that responds to and processes instructions fetched from the main memory unit 422. In many embodiments, the central processing unit 421 is provided by a microprocessor unit, such as: those manufactured by Intel Corporation of Mountain View, Calif.; those manufactured by Motorola Corporation of Schaumburg, Ill.; those manufactured by Transmeta Corporation of Santa Clara, Calif.; those manufactured by International Business Machines of White Plains, N.Y.; or those manufactured by Advanced Micro Devices of Sunnyvale, Calif. Other examples include SPARC processors, ARM processors, processors used to build UNIX/LINUX "white" boxes, and processors for mobile devices. The computing device 400 may be based on any of these processors, or any other processor capable of operating as described herein.

Main memory unit 422 may be one or more memory chips capable of storing data and allowing any storage location to be directly accessed by the microprocessor 421. The main memory 422 may be based on any available memory chips capable of operating as described herein. In the embodiment shown in FIG. 4B, the processor 421 communicates with main memory 422 via a system bus 450. FIG. 4C depicts an embodiment of a computing device 400 in which the processor communicates directly with main memory 422 via a memory port 403. FIG. 4C also depicts an embodiment in which the main processor 321 communicates directly with cache memory 440 via a secondary bus, sometimes referred to as a backside bus. In other embodiments, the main processor 421 communicates with cache memory 440 using the system bus 450.

In the embodiment shown in FIG. 4B, the processor 421 communicates with various I/O devices 430 via a local system bus 450. Various buses may be used to connect the central processing unit 421 to any of the I/O devices 430, including a VESA VL bus, an ISA bus, an EISA bus, a MicroChannel Architecture (MCA) bus, a PCI bus, a PCI-X bus, a PCI-Express bus, or a NuBus. For embodiments in which the I/O device is a video display 424, the processor 421 may use an Advanced Graphics Port (AGP) to communicate with the display 424. FIG. 4C depicts an embodiment of a computer 400 in which the main processor 421 also communicates directly with an I/O device 430b via, for example, HYPERTRANSPORT, RAPIDIO, or INFINIBAND communications technology.

One or more of a wide variety of I/O devices 430a-n may be present in or connected to the computing device 400, each of which may be of the same or different type and/or form. Input devices include keyboards, mice, trackpads, trackballs, microphones, scanners, cameras, and drawing tablets. Output devices include video displays, speakers, inkjet printers, laser printers, 3D printers, and dye-sublimation printers. The I/O devices may be controlled by an I/O controller 423 as shown in FIG. 4B. Furthermore, an I/O device may also provide storage and/or an installation medium 416 for the computing device 400. In some embodiments, the computing device 400 may provide USB connections (not shown) to receive handheld USB storage devices such as the USB Flash Drive line of devices manufactured by Twintech Industry, Inc. of Los Alamitos, Calif.

Referring still to FIG. 4B, the computing device 100 may support any suitable installation device 416, such as a floppy disk drive for receiving floppy disks such as 3.5-inch, 5.25-inch disks or ZIP disks; a CD-ROM drive; a CD-R/RW drive; a DVD-ROM drive; tape drives of various formats; a USB device; a hard-drive or any other device suitable for installing software and programs. In some embodiments, the computing device 400 may provide functionality for installing software over a network 404. The computing device 400 may further comprise a storage device, such as one or more hard disk drives or redundant arrays of independent disks, for storing an operating system and other software. Alternatively, the computing device 100 may rely on memory chips for storage instead of hard disks.

Furthermore, the computing device 400 may include a network interface 418 to interface to the network 404 through a variety of connections including, but not limited to, standard telephone lines, LAN or WAN links (e.g., 802.11, T1, T3, 56kb, X.25, SNA, DECNET), broadband connections (e.g., ISDN, Frame Relay, ATM, Gigabit Ethernet, Ethernet-over-SONET), wireless connections, or some combination of any or all of the above. Connections can be established using a variety of communication protocols (e.g., TCP/IP, IPX, SPX, NetBIOS, Ethernet, ARCNET, SONET, SDH, Fiber Distributed Data Interface (FDDI), RS232, IEEE 802.11, IEEE 802.11a, IEEE 802.11b, IEEE 802.11g, IEEE 802.11n, 802.15.4, Bluetooth, ZIGBEE, CDMA, GSM, WiMax, and direct asynchronous connections). In one embodiment, the computing device 400 communicates with other computing devices 100' via any type and/or form of gateway or tunneling protocol such as Secure Socket Layer (SSL) or Transport Layer Security (TLS). The network interface 418 may comprise a built-in network adapter, network interface card, PCMCIA network card, card bus network adapter, wireless network adapter, USB network adapter, modem, or any other device suitable for interfacing the computing device 100 to any type of network capable of communication and performing the operations described herein.

In further embodiments, an I/O device 430 may be a bridge between the system bus 150 and an external communication bus, such as a USB bus, an Apple Desktop Bus, an RS-232 serial connection, a SCSI bus, a FireWire bus, a FireWire 800 bus, an Ethernet bus, an AppleTalk bus, a Gigabit Ethernet bus, an Asynchronous Transfer Mode bus, a HIPPI bus, a Super HIPPI bus, a SerialPlus bus, a SCI/LAMP bus, a FibreChannel bus, or a Serial Attached small computer system interface bus.

A computing device 400 of the sort depicted in FIGS. 4B and 4C typically operates under the control of operating systems, which control scheduling of tasks and access to system resources. The computing device 400 can be running any operating system such as any of the versions of the MICROSOFT WINDOWS operating systems, the different releases of the UNIX and LINUX operating systems, any version of the MAC OS for Macintosh computers, any embedded operating system, any real-time operating system, any open source operating system, any proprietary operating system, any operating systems for mobile computing devices, or any other operating system capable of running on the computing device and performing the operations described herein. Typical operating systems include, but are not limited to: WINDOWS 3.x, WINDOWS 95, WINDOWS 98, WINDOWS 2000, WINDOWS NT 3.1-4.0, WINDOWS CE, WINDOWS XP, WINDOWS 7, WINDOWS 8, WINDOWS VISTA, and WINDOWS 10, all of which are manufactured by Microsoft Corporation of Redmond, Wash.; any version of MAC OS manufactured by Apple Inc. of Cupertino, Calif.; OS/2 manufactured by International Business Machines of Armonk, N.Y.; Red Hat Enterprise Linux, a Linus-variant operating system distributed by Red Hat, Inc., of Raleigh, N.C.; Ubuntu, a freely-available operating system distributed by Canonical Ltd. of London, England; or any type and/or form of a Unix operating system, among others.

The computing device 400 can be any workstation, desktop computer, laptop or notebook computer, server, portable computer, mobile telephone or other portable telecommunication device, media playing device, a gaming system, mobile computing device, or any other type and/or form of computing, telecommunications or media device that is capable of communication and that has sufficient processor power and memory capacity to perform the operations described herein. In some embodiments, the computing device 100 may have different processors, operating systems, and input devices consistent with the device. In other embodiments, the computing device 400 is a mobile device, such as a JAVA-enabled cellular telephone/smartphone or personal digital assistant (PDA). The computing device 400 may be a mobile device such as those manufactured, by way of example and without limitation, by Apple Inc. of Cupertino, Calif.; Google/Motorola Div. of Ft. Worth, Tex.; Kyocera of Kyoto, Japan; Samsung Electronics Co., Ltd. of Seoul, Korea; Nokia of Finland; Hewlett-Packard Development Company, L.P. and/or Palm, Inc. of Sunnyvale, Calif.; Sony Ericsson Mobile Communications AB of Lund, Sweden; or Research In Motion Limited of Waterloo, Ontario, Canada. In yet other embodiments, the computing device 100 is a smartphone, POCKET PC, POCKET PC PHONE, or other portable mobile device supporting Microsoft Windows Mobile Software.

In some embodiments, the computing device 400 is a digital audio player. In one of these embodiments, the computing device 400 is a digital audio player such as the Apple IPOD, IPOD TOUCH, IPOD NANO, and IPOD SHUFFLE lines of devices manufactured by Apple Inc. In another of these embodiments, the digital audio player may function as both a portable media player and as a mass storage device. In other embodiments, the computing device 100 is a digital audio player such as those manufactured by, for example, and without limitation, Samsung Electronics America of Ridgefield Park, N.J., or Creative Technologies Ltd. of Singapore. In yet other embodiments, the computing device 400 is a portable media player or digital audio player supporting file formats including, but not limited to, MP3, WAV, M4A/AAC, WMA Protected AAC, AEFF, Audible audiobook, Apple Lossless audio file formats, and .mov, .m4v, and .mp4 MPEG-4 (H.264/MPEG-4 AVC) video file formats.

In some embodiments, the computing device 400 includes a combination of devices, such as a mobile phone combined with a digital audio player or portable media player. In one of these embodiments, the computing device 100 is a device in the Google/Motorola line of combination digital audio players and mobile phones. In another of these embodiments, the computing device 400 is a device in the IPHONE smartphone line of devices manufactured by Apple Inc. In still another of these embodiments, the computing device 400 is a device executing the ANDROID open source mobile phone platform distributed by the Open Handset Alliance; for example, the device 100 may be a device such as those provided by Samsung Electronics of Seoul, Korea, or HTC Headquarters of Taiwan, R.O.C. In other embodiments, the computing device 400 is a tablet device such as, for example and without limitation, the IPAD line of devices manufactured by Apple Inc.; the PLAYBOOK manufactured by Research In Motion; the CRUZ line of devices manufactured by Velocity Micro, Inc. of Richmond, Va.; the FOLIO and THRIVE line of devices manufactured by Toshiba America Information Systems, Inc. of Irvine, Calif.; the GALAXY line of devices manufactured by Samsung; the HP SLATE line of devices manufactured by Hewlett-Packard; and the STREAK line of devices manufactured by Dell, Inc. of Round Rock, Tex.

A computing device 400 may be a file server, application server, web server, proxy server, appliance, network appliance, gateway, application gateway, gateway server, virtualization server, deployment server, SSL VPN server, or firewall. In some embodiments, a computing device 400 provides a remote authentication dial-in user service, and is referred to as a RADIUS server. In other embodiments, a computing device 100 may have the capacity to function as either an application server or as a master application server. In still other embodiments, a computing device 400 is a blade server.

A computing device 400 may be referred to as a client node, a client machine, an endpoint node, or an endpoint. In some embodiments, a client 400 has the capacity to function as both a client node seeking access to resources provided by a server and as a server node providing access to hosted resources for other clients.

In some embodiments, a first, client computing device 400a communicates with a second, server computing device 400b. In one embodiment, the client communicates with one of the computing devices 400 in a server farm. Over the network, the client can, for example, request execution of various applications hosted by the computing devices 400 in the server farm and receive output data of the results of the application execution for display.

Having described certain embodiments of methods and systems for maintaining a physical asset based on recommendations generated by analyzing a model of the physical asset, the model comprising a plurality of components and forming a physics-based digital twin of the physical asset, it will now become apparent to one of skill in the art that other embodiments incorporating the concepts of the disclosure may be used. Therefore, the disclosure should not be limited to certain embodiments, but rather should be limited only by the spirit and scope of the following claims.

What is claimed is:

1. A method for maintaining a physical asset based on recommendations generated by analyzing a model of the physical asset, the model comprising a plurality of components and forming a physics-based digital twin of the physical asset, the method comprising:
   (a) constructing, by a computing device, using a port-reduced static condensation reduced basis element approximation of at least a portion of a partial differential equation, a composite model of a plurality of models, each of the plurality of models representing at least one of a plurality of components, each of the plurality of components representing at least one region of a physical asset;
   (b) analyzing, by the computing device, for at least one model in the plurality of models, an error indicator identifying a level of error associated with the at least one model, to determine that the identified level of error exceeds a tolerance level;
   (c) increasing, by the computing device, a number of basis functions in the port-reduced static condensation reduced basis element approximation, based upon a determination that the at least one model has a level of error exceeding the tolerance level;
   (d) repeating (b) and (c) for each model in the plurality of models until the level of error for each of the plurality of models is beneath the tolerance level;
   (e) receiving, by the computing device, from a first operational data source associated with the physical asset, first operational data associated with at least one region of the physical asset represented by at least one parameter of at least one component in the plurality of components;
   (f) updating, by the computing device, the composite model, based upon the received first operational data; and
   (g) providing, by the computing device, a recommendation for maintaining the physical asset, based upon the updated composite model.

2. The method of claim 1, wherein (a)-(d) are performed before (e).

3. The method of claim 1, further comprising, after (a)-(d) and before (e), generating a physics-based analysis of the physical asset using the composite model, wherein generating further comprises:
   receiving, by the computing device, first user input identifying an input value indicative of at least one physical condition under which the physical asset is to be evaluated; and
   using, by the computing device, the composite model to generate at least one output value based at least in part on the at least one input value, wherein the at least one output value is indicative of a behavior of the physical system under the at least one physical condition, wherein the at least one output value comprises a plurality of output values over an N-dimensional domain.

4. The method of claim 3, wherein receiving further comprises receiving, by the computing device, user input identifying an input value extracted from an inspection report based on a physical inspection of the physical asset.

5. The method of claim 3, wherein receiving further comprises receiving, by the computing device, user input identifying an input value extracted from operational data received from a sensor associated with the physical asset.

6. The method of claim 1 further comprising: (h) generating, by a simulation tool executed by the computing device, a visual rendering of the composite model including a visualization of at least one result of a physics-based analysis of the physical asset.

7. The method of claim 6 further comprising: (i) updating, by the simulation tool, the visual rendering, based upon the received first operational data.

8. The method of claim 1, wherein (d) comprises repeating (b) and (c) for each model in the plurality of models until a threshold number of iterations is reached.

9. The method of claim 1, wherein (e) further comprises receiving, by the computing device, from the first operational data source associated with the physical asset, first operational data generated by a sensor associated with the physical asset.

10. The method of claim 1, wherein (e) further comprises receiving, by the computing device, from the first operational data source associated with the physical asset, first operational data extracted from an inspection report associated with the physical asset.

11. The method of claim 1, wherein (e) further comprises receiving, by the computing device, from the first operational data source associated with the physical asset, first operational data extracted from a report generated by an operator of the physical asset.

12. The method of claim 1 further comprising: (h) providing, by the computing device, a recommendation for identifying a plurality of aspects of the physical asset to inspect the plurality of aspects ranked according to a level of priority, based upon the updated composite model.

13. The method of claim 1 further comprising: (h) providing, by the computing device, a recommendation for determining a level of feasibility of a proposed modification to the physical asset, based upon the updated composite model.

14. The method of claim 1 further comprising: (h) providing, by the computing device, a recommendation for determining a level of operability of the physical asset, based upon the updated composite model.

15. The method of claim 1 further comprising:
   (h) receiving, by the computing device, from the first operational data source associated with the physical asset, second operational data associated with the at least one region of the physical asset represented by the at least one parameter of the at least one component in the plurality of components;
   (i) updating, by the computing device, the composite model, based upon the received second operational data; and
   (j) providing, by the computing device, a second recommendation for maintaining the physical asset, based upon the updated composite model.

16. The method of claim 1 further comprising:
(h) receiving, by the computing device, from a second operational data source associated with the physical asset, second operational data associated with at least a second region of the physical asset represented by at least a second parameter of at least a second component in the plurality of components;
(i) updating, by the computing device, the composite model, based upon the received second operational data; and
(j) providing, by the computing device, a second recommendation for maintaining the physical asset, based upon the updated composite model.

17. The method of claim 1 further comprising:
(h) receiving second operational data from the first operational data source;
(i) updating at least one model in the plurality of models based upon the received second operational data;
(j) analyzing, by the computing device, for at least one model in the plurality of models, an error indicator identifying a level of error associated with the at least one model, to determine whether the identified level of error exceeds a tolerance level;
(k) increasing, by the computing device, a number of basis functions in the port-reduced static condensation reduced basis element approximation, based upon a determination that the at least one model has a level of error exceeding the tolerance level;
(l) repeating (b) and (c) for each model in the plurality of models until the level of error each of the plurality of models is beneath the tolerance level;
(m) updating, by the computing device, the composite model, based upon the received second operational data; and
(n) providing, by the computing device, a recommendation for maintaining the physical asset, based upon the updated composite model.

18. The method of claim 1 further comprising:
(h) receiving second operational data from a second operational data source;
(i) updating at least model in the plurality of models based upon the received second operational data;
(j) analyzing, by the computing device, for at least one model in the plurality of models, an error indicator identifying a level of error associated with the at least one model, to determine whether the identified level of error exceeds a tolerance level;
(k) increasing, by the computing device, a number of basis functions in the port-reduced static condensation reduced basis element approximation, based upon a determination that the at least one model has a level of error exceeding the tolerance level;
(l) repeating (b) and (c) for each model in the plurality of models until the level of error each of the plurality of models is beneath the tolerance level;
(m) updating, by the computing device, the composite model, based upon the received second operational data; and
(n) providing, by the computing device, a recommendation for maintaining the physical asset, based upon the updated composite model.

19. A non-transitory, computer-readable medium encoded with computer-executable instructions that, when executed on a computing device, cause the computing device to carry out a method for maintaining a physical asset based on recommendations generated by analyzing a model of the physical asset, the model comprising a plurality of components and forming a physics-based digital twin of the physical asset, the method comprising:
(a) constructing, by a computing device, using a port-reduced static condensation reduced basis element approximation of at least a portion of a partial differential equation, a composite model of a plurality of models, each of the plurality of models representing at least one of a plurality of components, each of the plurality of components representing at least one region of a physical asset
(b) analyzing, by the computing device, for at least one model in the plurality of models, an error indicator identifying a level of error associated with the at least one model, to determine that the identified level of error exceeds a tolerance level;
(c) increasing, by the computing device, a number of basis functions in the port-reduced static condensation reduced basis element approximation, based upon a determination that the at least one model has a level of error exceeding the tolerance level;
(d) repeating (b) and (c) for each model in the plurality of models until the level of error for each of the plurality of models is beneath the tolerance level;
(e) receiving, by the computing device, from a first operational data source associated with the physical asset, first operational data associated with at least one region of the physical asset represented by at least one parameter of at least one component in the plurality of components;
updating, by the computing device, the composite model, based upon the received first operational data; and
(g) providing, by the computing device, a recommendation for maintaining the physical asset, based upon the updated composite model.

* * * * *